US012575046B2

(12) United States Patent
Cha et al.

(10) Patent No.: US 12,575,046 B2
(45) Date of Patent: Mar. 10, 2026

(54) DISPLAY APPARATUS INCLUDING A CENTRAL SUPPORT ASSEMBLY

(71) Applicant: LG DISPLAY CO., LTD., Seoul (KR)

(72) Inventors: Youhong Cha, Seoul (KR); Sangyong Park, Incheon (KR); Minhye Park, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 224 days.

(21) Appl. No.: 18/198,561

(22) Filed: May 17, 2023

(65) Prior Publication Data

US 2023/0380090 A1 Nov. 23, 2023

(30) Foreign Application Priority Data

May 18, 2022 (KR) ........................ 10-2022-0060862

(51) Int. Cl.
| | |
|---|---|
| *H05K 5/00* | (2025.01) |
| *F16M 11/00* | (2006.01) |
| *F16M 11/04* | (2006.01) |
| *F16M 11/08* | (2006.01) |
| *F16M 11/18* | (2006.01) |
| *F16M 11/22* | (2006.01) |
| *H05K 5/02* | (2006.01) |

(52) U.S. Cl.
CPC ......... *H05K 5/0234* (2013.01); *F16M 11/048* (2013.01); *F16M 11/08* (2013.01); *F16M 11/18* (2013.01); *F16M 11/22* (2013.01); *F16M 2200/08* (2013.01)

(58) Field of Classification Search
CPC .... H05K 5/0234; F16M 11/048; F16M 11/08; F16M 11/18; F16M 11/22; F16M 2200/08; G06F 1/1652; G06F 1/1601; G09F 9/301; G09F 9/335; G09F 9/35; G09F 9/372; G02B 26/005
See application file for complete search history.

(56) References Cited

U.S. PATENT DOCUMENTS

| | | | | |
|---|---|---|---|---|
| 6,532,147 B1 * | 3/2003 | Christ, Jr. | ............. | G06F 1/1679 |
| | | | | 248/922 |
| 8,199,471 B2 * | 6/2012 | Bemelmans | .............. | G09F 9/30 |
| | | | | 455/462 |

(Continued)

FOREIGN PATENT DOCUMENTS

| | | |
|---|---|---|
| CN | 103941456 A | 7/2014 |
| CN | 208487385 U | 2/2019 |

(Continued)

*Primary Examiner* — Rockshana D Chowdhury
(74) *Attorney, Agent, or Firm* — Birch, Stewart, Kolasch & Birch, LLP

(57) ABSTRACT

A display apparatus includes a flexible display panel, a central support assembly supporting a central portion of the display panel and coupled to a rear surface of the display panel two edge support assemblies respectively supporting opposing sides of the display panel, the two edge support assemblies being coupled to the rear surface of the display panel, and a main body supporting the central support assembly and the two edge support assemblies, the main body including an opening in a central portion of the main body. The central support assembly moves in a first direction along the opening of the main body.

23 Claims, 21 Drawing Sheets

(56)                  References Cited

U.S. PATENT DOCUMENTS

| | | | | |
|---|---|---|---|---|
| 8,379,377 | B2 * | 2/2013 | Walters | G06F 1/1641 |
| | | | | 361/679.04 |
| 9,119,298 | B2 * | 8/2015 | Park | G06F 1/1601 |
| 9,123,290 | B1 * | 9/2015 | Cho | G06F 1/1652 |
| 9,189,015 | B2 * | 11/2015 | Tseng | G06F 1/1681 |
| 9,304,539 | B2 | 4/2016 | Song et al. | |
| 9,390,642 | B2 | 7/2016 | Kim et al. | |
| 9,510,440 | B2 * | 11/2016 | Nam | G06F 1/1652 |
| 9,519,313 | B2 * | 12/2016 | Kim | G06F 1/166 |
| 9,658,646 | B2 * | 5/2017 | Song | G09F 9/30 |
| 9,843,758 | B2 * | 12/2017 | Park | G09G 3/20 |
| 9,980,399 | B2 * | 5/2018 | Cho | H05K 5/0217 |
| 10,025,024 | B2 | 7/2018 | Shim et al. | |
| 10,025,347 | B2 | 7/2018 | Song et al. | |
| 10,193,095 | B2 * | 1/2019 | Seo | H10K 50/11 |
| 10,321,583 | B2 * | 6/2019 | Seo | H04N 5/64 |
| 10,349,535 | B2 * | 7/2019 | Kwon | G06F 1/1601 |
| 10,476,011 | B2 | 11/2019 | Kang et al. | |
| 10,484,642 | B2 * | 11/2019 | Park | H10K 59/351 |
| 10,506,726 | B2 * | 12/2019 | Kang | H10K 77/111 |
| 10,645,828 | B2 * | 5/2020 | Kim | F16M 13/02 |
| 11,127,323 | B2 * | 9/2021 | Kim | G06F 1/1652 |
| 11,187,848 | B2 * | 11/2021 | Ohnishi | G06F 1/182 |
| 11,340,651 | B2 * | 5/2022 | Lee | G06F 1/1618 |
| 11,416,034 | B2 * | 8/2022 | Yoo | G09F 9/301 |
| 11,755,066 | B2 * | 9/2023 | Chang | G09F 9/301 |
| | | | | 361/679.01 |
| 11,788,672 | B2 * | 10/2023 | Cho | F16M 11/125 |
| | | | | 361/679.01 |
| 11,798,439 | B2 * | 10/2023 | Oh | G09F 9/35 |
| 11,860,694 | B2 * | 1/2024 | Shin | G06F 1/1637 |
| 11,886,251 | B2 * | 1/2024 | Liu | G06F 1/1624 |
| 11,892,873 | B2 * | 2/2024 | Chen | G06F 1/1601 |
| 11,914,423 | B2 * | 2/2024 | Shin | H04M 1/0268 |
| 11,994,913 | B2 * | 5/2024 | Jin | G06F 1/1601 |
| 12,019,474 | B2 * | 6/2024 | Song | H04M 1/0268 |
| 12,019,479 | B2 * | 6/2024 | Han | G06F 1/1652 |
| 12,055,975 | B2 * | 8/2024 | Cho | G06F 1/1624 |
| 12,164,338 | B2 * | 12/2024 | Kim | G06F 1/1624 |
| 12,181,917 | B2 * | 12/2024 | Shin | G06F 1/1624 |
| 12,216,501 | B2 * | 2/2025 | Wang | G06F 1/1675 |
| 12,222,763 | B2 * | 2/2025 | Cha | G06F 1/1652 |
| 2004/0061683 | A1 * | 4/2004 | Mochizuki | G06F 3/021 |
| | | | | 345/168 |
| 2013/0170126 | A1 * | 7/2013 | Lee | G06F 1/1632 |
| | | | | 361/810 |
| 2014/0067535 | A1 * | 3/2014 | Rezaei | G06F 16/285 |
| | | | | 705/14.54 |
| 2014/0132935 | A1 * | 5/2014 | Kim | G03B 21/56 |
| | | | | 353/79 |
| 2014/0198465 | A1 * | 7/2014 | Park | G09F 9/00 |
| | | | | 361/749 |
| 2015/0130775 | A1 * | 5/2015 | Kim | G09G 3/2085 |
| | | | | 345/82 |
| 2015/0195932 | A1 * | 7/2015 | Lee | H04N 5/64 |
| | | | | 361/749 |
| 2016/0044806 | A1 | 2/2016 | Park et al. | |
| 2016/0050772 | A1 | 2/2016 | Park et al. | |
| 2019/0138058 | A1 * | 5/2019 | Kwon | G09G 3/22 |
| 2019/0198783 | A1 * | 6/2019 | Kim | H10H 20/855 |
| 2020/0053891 | A1 * | 2/2020 | Kim | G06F 3/14 |
| 2020/0201394 | A1 * | 6/2020 | Choi | G09F 9/301 |
| 2020/0394942 | A1 * | 12/2020 | Kim | G06F 1/1652 |
| 2020/0409418 | A1 * | 12/2020 | Yoo | G09F 9/301 |
| 2021/0090476 | A1 * | 3/2021 | Kang | G09F 9/335 |
| 2022/0189351 | A1 * | 6/2022 | Choi | G06F 1/1637 |
| 2023/0380090 | A1 * | 11/2023 | Cha | F16M 11/08 |
| 2023/0397473 | A1 | 12/2023 | Jeong et al. | |

FOREIGN PATENT DOCUMENTS

| | | |
|---|---|---|
| CN | 111326077 A | 6/2020 |
| CN | 213206998 U | 5/2021 |
| CN | 215891807 U | 2/2022 |
| KR | 10-2014-0067535 A | 6/2014 |
| KR | 10-2014-0094297 A | 7/2014 |
| KR | 10-1986796 B1 | 7/2014 |
| KR | 10-2014-0105148 A | 9/2014 |
| KR | 10-1507206 B1 | 3/2015 |
| KR | 10-2015-0080837 A | 7/2015 |
| KR | 10-2015-0136429 A | 12/2015 |
| KR | 10-2016-0016333 A | 2/2016 |
| KR | 10-2016-0019761 A | 2/2016 |
| KR | 10-2017-0039022 A | 4/2017 |
| KR | 10-2017-0078984 A | 7/2017 |
| KR | 10-2017-0113956 A | 10/2017 |
| KR | 10-2019-0092966 A | 8/2019 |
| KR | 10-2021-0001447 A | 1/2021 |
| KR | 10-2021-0046206 A | 4/2021 |
| KR | 10-2395014 B1 | 5/2022 |

* cited by examiner

DISPLAY APPARATUS INCLUDING A CENTRAL SUPPORT ASSEMBLY

CROSS-REFERENCE TO RELATED APPLICATION

This application claims priority under 35 U.S.C. § 119(a) to Korean Patent Application No. 10-2022-0060862 filed in the Republic of Korea on May 18, 2022, which is hereby incorporated by reference in its entirety for all purposes as if fully set forth herein.

BACKGROUND

Field

The present disclosure relates to a display apparatus. More specifically, the present disclosure relates to a display apparatus capable of changing a curvature of a display panel.

Description of Related Art

A flat display apparatus, which may not be capable of bending or changing its curvature, has a limited viewing angle that is within a certain range. Thus, a viewer cannot properly view an image displayed on a screen of the flat display apparatus while being at a location outside the range of the viewing angle. The flat display apparatus has a limitation that it is difficult for the flat display apparatus to realize a three-dimensional image or an immersive image. Further, the display apparatuses of the related art can include a fixed curved display panel that is not capable of bending or changing its curvature. Therefore, the curved display panel of the related art is not capable of adjusting its viewing angle by adjusting its curvature, to best suit the displayed contents.

In order to overcome these limitations, recently, a curved display apparatus in which a display panel itself has an adjustable curved surface using a flexible display panel has been introduced.

SUMMARY OF THE DISCLOSURE

The curved display apparatus has the advantages of providing a larger viewing angle than that of the flat display apparatus and providing a three-dimensional or immersive image to the user. However, in the curved display apparatus, a curvature of the display panel is fixed. Thus, the display curvature cannot be changed based on a location or a distance of the user or the viewer using the curved display apparatus or based on a type of image content.

Accordingly, the inventors of the present disclosure have invented a display apparatus capable of changing a curvature of a display panel using a simple structure.

A technical purpose according to an embodiment of the present disclosure is to provide a display apparatus in which a viewer or a user can freely change a curvature of a display panel as needed.

Moreover, a technical purpose according to an embodiment of the present disclosure is to provide a display apparatus in which a viewer or a user can freely change a height of a display panel as needed.

Purposes according to the present disclosure are not limited to the above-mentioned purposes. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims or combinations thereof.

A display apparatus according to an embodiment of the present disclosure includes a flexible display panel; a central support assembly supporting a central portion of the display panel and coupled to a rear surface of the display panel; two edge support assemblies respectively supporting both opposing side edges of the display panel and coupled to the rear surface of the display panel; and a main body supporting the central support assembly and the edge support assemblies. The central support assembly moves frontwards and rearwards along an opening defined in a central portion of the main body.

A display apparatus according to an embodiment of the present disclosure includes a flexible display panel; a central support assembly supporting a central portion of the display panel and coupled to a rear surface of the display panel; and a main body having a linear driver coupled to a lower portion of the central support assembly, wherein the linear driver moves the central support assembly and a central portion of the display panel frontwards and rearwards along an opening defined in a central portion of the main body.

Details of other embodiments are included in the detailed descriptions and drawings.

According to the embodiments of the present disclosure, the display apparatus capable of changing the curvature of the display panel can be implemented using a simple structure.

Moreover, according to the embodiments of the present disclosure, the curvature of the display panel can be easily changed to a desired amount by moving the central support assembly coupled to the center of the display panel frontwards and rearwards.

Moreover, according to the embodiments of the present disclosure, the edge support assemblies on both sides of the display panel rotate and move in accordance with the movement of the central support assembly. Thus the curvature of the display panel can be formed naturally, a the tensile stress applied to the display panel during the curvature change process can be reduced or removed. Therefore, reliability of the display panel can be improved.

Moreover, according to the embodiments of the present disclosure, the lengths of the central support assembly and the edge support assemblies coupled to the display panel can be adjusted. Thus, the viewer or the user can freely change the height of the display panel as needed.

Moreover, according to the embodiments of the present disclosure, the linear driver can be received in the main body disposed under the display panel, such that the aesthetics of a rear side of the display apparatus can be improved.

Effects of the present disclosure are not limited to the effects mentioned above, and other effects not mentioned will be clearly understood by those skilled in the art from the descriptions below.

DETAILED DESCRIPTION OF THE EMBODIMENTS

Figure 1:
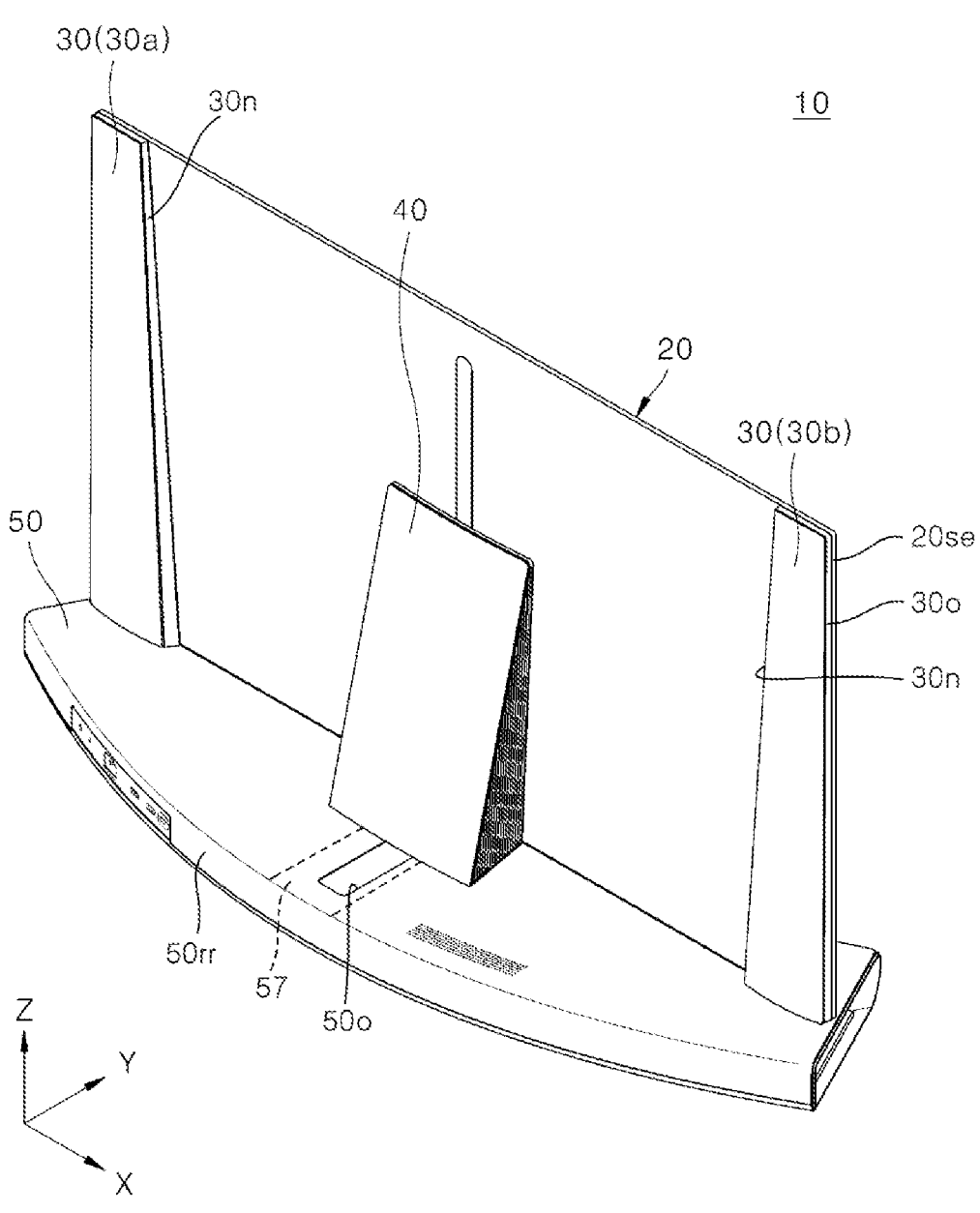
FIG. 1 is a perspective view showing a state in which a display apparatus according to an embodiment of the present disclosure is in a flat mode.

Advantages and features of the present disclosure, and a method of achieving the advantages and features will become apparent with reference to embodiments described later in detail together with the accompanying drawings. However, the present disclosure is not limited to the embodiments as disclosed under, but can be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms such as "comprise", "including", "include", and "having," etc. when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order or sequence. Thus, a first element, component, region, layer or section described under could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is separate explicit description thereof.

It will be understood that when an element or layer is referred to as being "connected to", or "coupled to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. For example, unless otherwise stated or clear from the context, the expression that 'x uses a or b' means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, display apparatuses according to embodiments of the present disclosure will be described in detail with reference to the accompanying drawings. All the components of each display apparatus according to all embodiments of the present disclosure are operatively coupled.

FIG. 1 to FIG. 4 are diagrams showing a state in which a display apparatus according to an embodiment of the present disclosure is in a flat mode.

Figure 2:
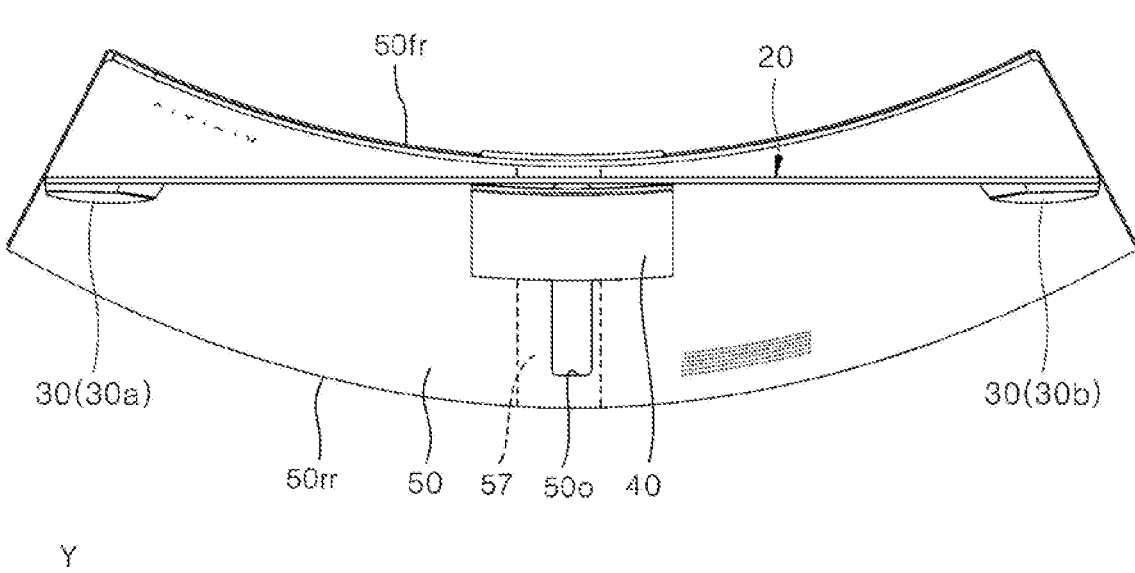
FIG. 2 is a plan view showing a state in which a display apparatus according to an embodiment of the present disclosure is in a flat mode.
Figure 2:
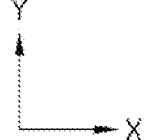
Figure 3:
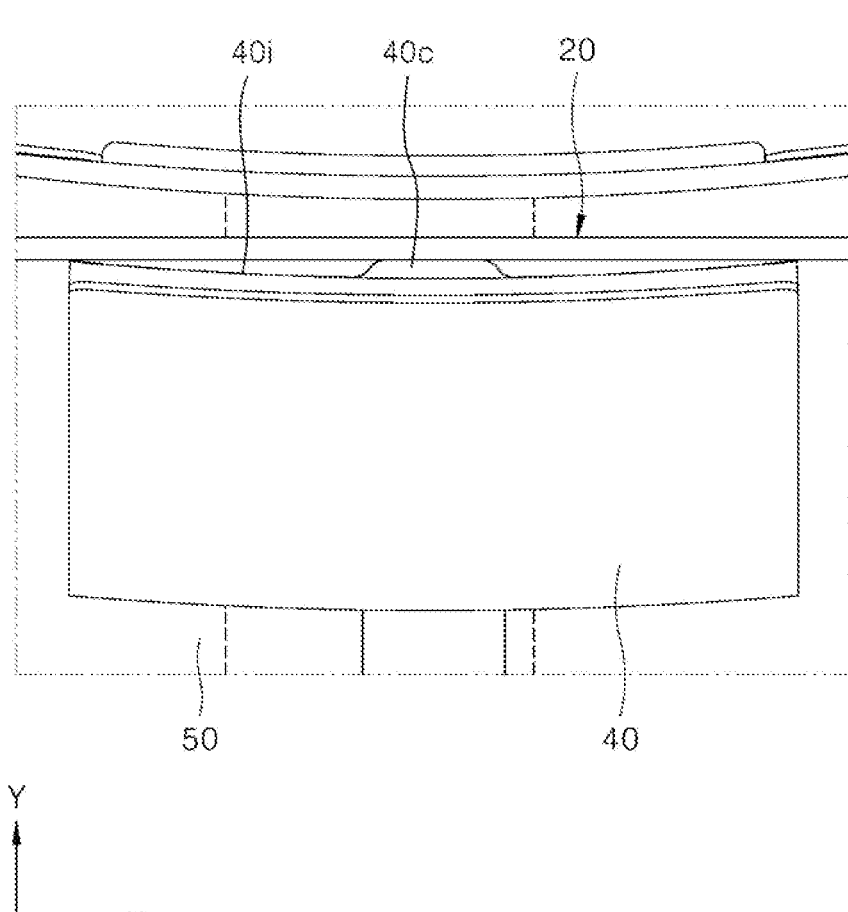
FIG. 3 is an enlarged view of a central area of the display apparatus as shown in FIG. 2.
Figure 4:
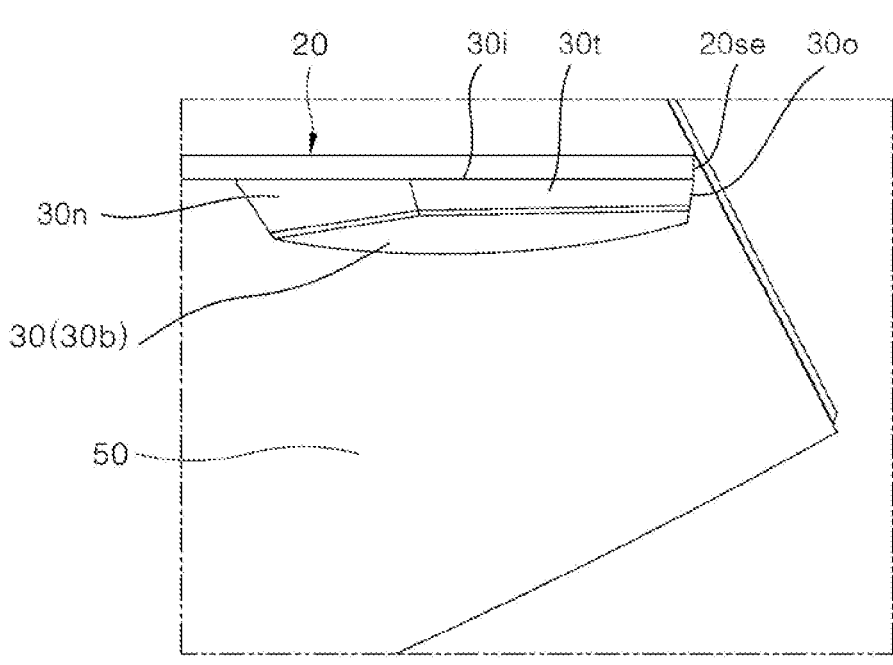
FIG. 4 is an enlarged view of an edge area of the display apparatus as shown in FIG. 2.
Figure 4:
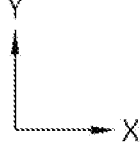

Particularly, FIG. 1 is a perspective view showing a state in which a display apparatus according to an embodiment of the present disclosure is in a flat mode. FIG. 2 is a plan view showing a state in which a display apparatus according to an embodiment of the present disclosure is in a flat mode. FIG. 3 is an enlarged view of a central area of the display apparatus as shown in FIG. 2. FIG. 4 is an enlarged view of an edge area of the display apparatus as shown in FIG. 2.

Referring to FIG. 1 and FIG. 2, a display apparatus 10 according to an embodiment of the present disclosure includes a display panel 20 displaying an image, a central support assembly 40 supporting a central portion of the display panel 20 and coupled to a rear surface of the display panel 20, two edge support assemblies 30 respectively supporting both opposing side edges of the display panel 20 and coupled to the rear surface of the display panel 20, and a main body 50 supporting the central support assembly 40 and the edge support assemblies 30.

The display panel 20 can be a flexible display panel and can be bent when a force is applied, (e.g., manually by a user), to the display panel 20.

The display panel 20 can be embodied as, for example, an organic light-emitting display panel, an electrophoretic display panel, a liquid crystal display panel, an electrowetting display panel, or a quantum dot display panel, but is not limited thereto.

The display panel 20 can be housed in a flexible (e.g., elastic) casing surrounding an edge of the display panel 20. The flexible casing can be made of a flexible material such that the casing can be bent together with the display panel 20 when the display panel 20 is bent at a certain curvature. This flexible casing can be omitted depending on a type of the display panel 20.

In a top view of the display apparatus 10, for example, referring to FIG. 2, the main body 50 has a curved shape, a front surface 50fr of main body 50 has a first curvature, and a rear surface 50rr of the main body 50 has a second curvature. In one embodiment, the first curvature of the front surface 50fr can be the same as the second curvature of the rear surface 50rr. The front surface 50fr of the main body 50 refers to a side surface of the main body 50 facing a viewer using the display apparatus 10. The rear surface 50rr of the main body 50 refers to a side surface opposite to the front surface of the main body 50. The main body 50 receives a linear driver 57 (e.g., linear motor) within the casing, and an opening 50o extending in a front-back direction and defined in an upper surface of the casing in a corresponding manner to the linear driver 57. The linear driver 57 and the opening 50o can be located in a central portion of the main body 50. The opening 50o can have any shape, including a rectangular shape, a circular shape, or the like. The linear driver 57 will be described in detail later with reference to FIG. 12 and FIG. 13. The main body 50 can be provided with vents to release heat generated from internal circuitry components, such as circuit boards, processors, and the like. Further, the main body 50 can include a fan therein.

The central support assembly 40 can be coupled to the rear surface of the display panel 20 and can support the central portion of the display panel 20. In order to stably support the central portion of the display panel 20, the central support assembly 40 has a shape in which a thickness increases as the central support assembly 40 extends from a top to a bottom thereof. For example, the central support assembly 40 can have a triangular shape, with a greater thickness at a bottom of the central support assembly 40 that contacts the main body 50, and has a decreasing thickness from the bottom to a top of the central support assembly 40. Further, a side of the central support assembly can be coupled to the rear surface of the display panel 20 by any known means, such as by fastening, adhesive bonding, or the like. The central support assembly 40 can be coupled to the main body 50 so as to be movable in forward and backward directions of the display apparatus 10. To change the curvature of the display panel 20, the central support assembly 40 can be coupled to the linear driver 57 of the main body 50 and can linearly move along the opening 50o of the main body 50. When the display apparatus 10 is in a flat mode, for example, when the display panel 20 has a flat shape (e.g., substantially flat or planar shape), the central support assembly 40 can be disposed close to the front surface 50fr of the main body 50. When the central support assembly 40 moves, friction can occur between the central support assembly 40 and the main body 50. To reduce this friction, rollers can be mounted on a lower end of the central support assembly 40. The rollers can move within the opening 50o, and the rollers can be sized to match the size of the opening 50o. Further, instead of rollers, any other type of linear bearing can be used, such as an air bearing, a ball spline, a linear motion guide, a linear roller, a bearing or rail assembly, or the like.

The two edge support assemblies 30 can be provided to respectively support both opposing side edges of the display panel 20. The edge support assembly 30 can be coupled to the rear surface of the display panel 20 and can support the edge of the display panel 20. In order to stably support the edge of the display panel 20, the edge support assembly 30 can have a shape in which a width increases and a thickness increases as the edge support assembly 30 extends from a top to a bottom thereof. The width of the edge support assembly 30 can be a dimension in an X-axis direction, and the thickness of the edge support assembly 30 can be a dimension in a Y-axis direction. An outer edge 30o of the edge support assembly 30 can be parallel to a side edge 20se of the display panel 20. An inner edge 30n of the edge support assembly 30 can be inclined such that a spacing between the inner edge 30n and the outer edge 30o increases as the inner edge 30n and the outer edge 30o extend from the top to the bottom of the edge support assembly 30. Referring to FIG. 1 and FIG. 2, a left edge support assembly 30a located at a left side in the drawing can support a left edge of the display panel 20, while a right edge support assembly 30b located at a right side in the drawing can support a right edge of the display panel 20. The left edge support assembly 30a and the right edge support assembly 30b can have shapes symmetrical with each other around a center line of the display panel 20. As the left and right edge support assemblies 30a and 30b have symmetrical shapes with each other, the left and right edge support assemblies 30a and 30b can equally support the left edge and the right edge of the display panel 20 in the same manner, respectively. The left edge support assembly 30a can be referred to as a first edge support assembly, while the right edge support assembly 30b can be referred to as a second edge support assembly. The two edge support assemblies 30 can be rotatably coupled to the main body 50 so that the curvature of the display panel 20 can be formed naturally. Moreover, while the curvature of the display panel 20 is changed, the edge support assemblies 30 can rotate and at the same time, move horizontally in a predetermined range so that a tensile stress is not applied to the display panel 20. Each of the left edge support assembly 30a and the right edge support assembly 30b can have a width that decreases from a bottom surface thereof to a top surface thereof, and further, can have a top surface at a same height a top surface of the display panel 20.

As the central support assembly 40 linearly moves backward along the opening 50o of the main body 50 and the two edge support assemblies 30 rotate on the main body 50, the curvature of the display panel 20 can be changed. As a movement amount or a movement distance of the central support assembly 40 increases, the curvature of the display panel 20 can increase, and a rotation amount or a rotation angle of each of the two edge support assemblies 30 can increase.

Referring to FIG. 3, a front surface 40i of the central support assembly 40 facing the display panel 20 can have a coupling portion 40c that protrudes therefrom toward the rear surface of the display panel 20 and is coupled to the rear surface of the display panel 20. The front surface 40i of the central support assembly 40 can be a curved surface having a predetermined curvature. Further, when the display apparatus 10 is in the flat mode, for example, when the display panel 20 has the flat shape, both opposing side ends of the front surface 40i of the central support assembly 40 can contact the rear surface of the display panel 20.

Referring to FIG. 4, a front surface 30i of the edge support assembly 30 can be flat. Further, when the display apparatus 10 is in the flat mode, for example, when the display panel 20 has the flat shape, the front surface 30i of the edge support assembly 30 can contact the rear surface of the display panel 20. The outer edge 30o of the edge support assembly 30 can be parallel to the side edge 20se of the display panel 20, and the inner edge 30n of the edge support assembly 30 can be inclined such that the spacing between the inner edge 30n and the outer edge 30o increases as the assembly 30 extends downwardly. Thus, in a top view of the display apparatus 20, the inner edge 30n of the edge support assembly 30 can be viewed as a single surface adjacent to an upper surface 30t of the edge support assembly 30.

FIG. 5 to FIG. 8 are diagrams showing a state in which a display apparatus according to an embodiment of the present disclosure is in a curved mode.

Figure 5:
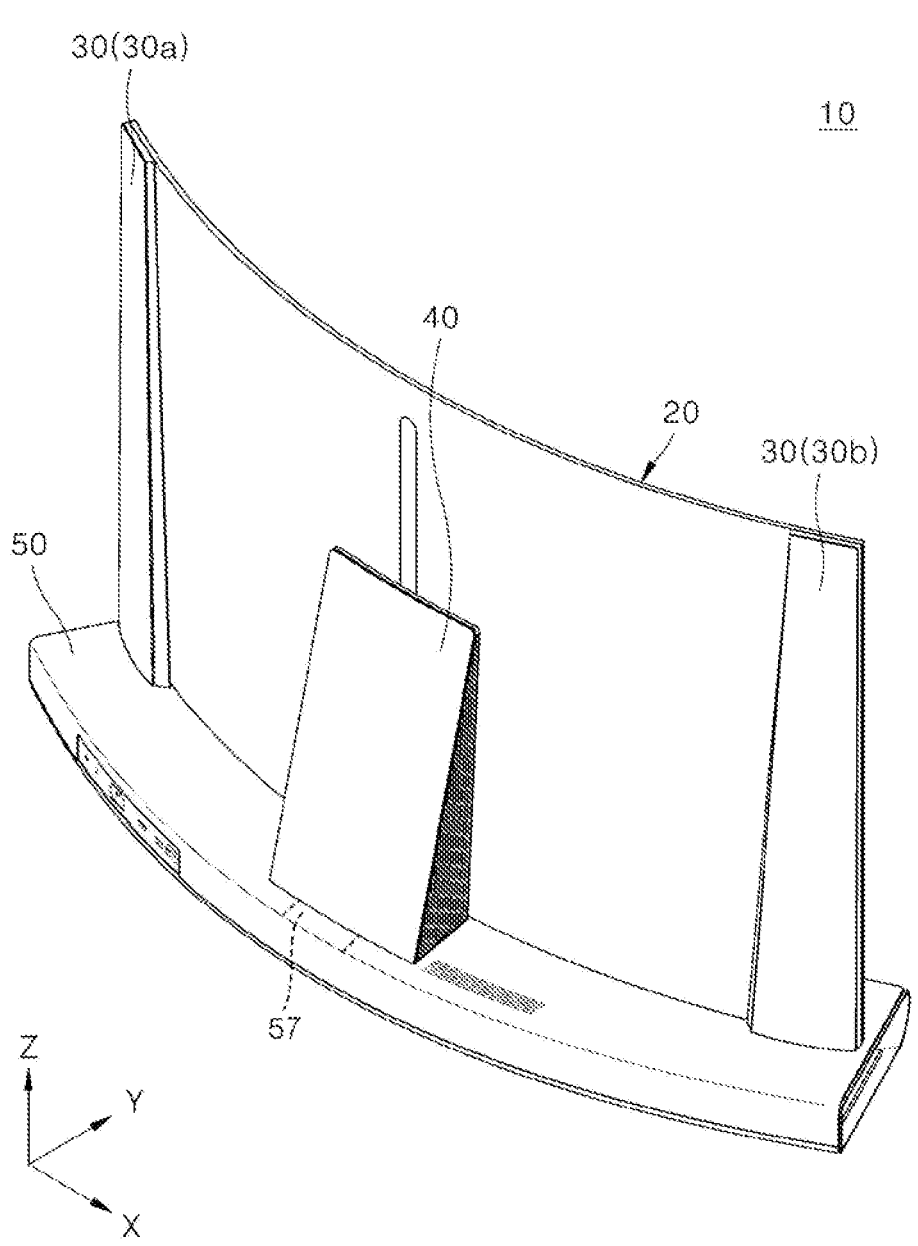
FIG. 5 is a perspective view showing a state in which a display apparatus according to an embodiment of the present disclosure is in a curved mode.
Figure 6:
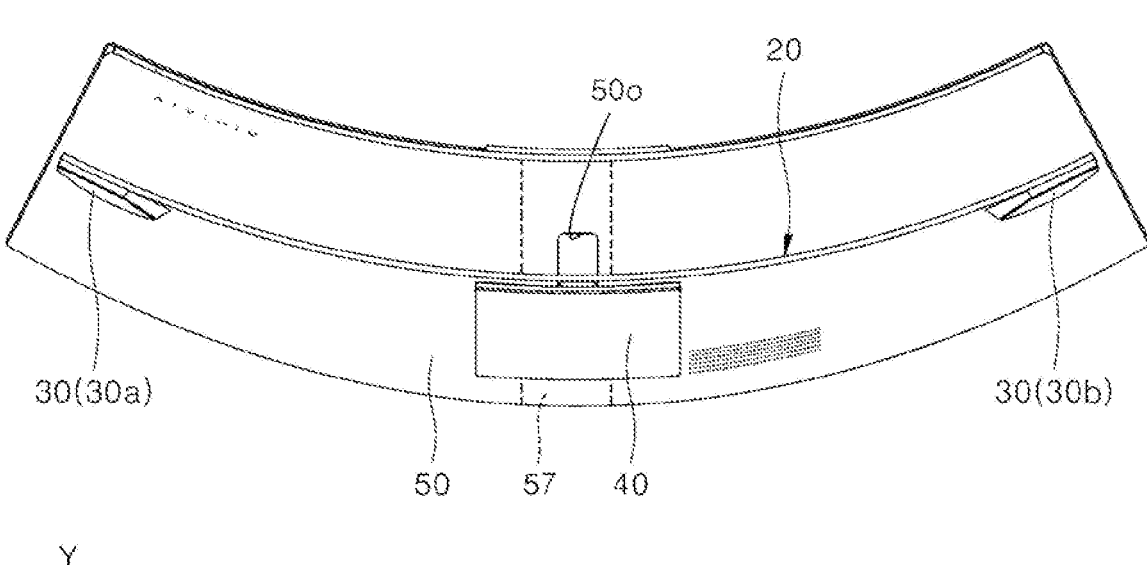
FIG. 6 is a plan view illustrating a state in which a display apparatus according to an embodiment of the present disclosure is in a curved mode.
Figure 6:
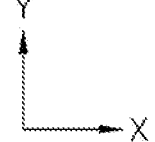
Figure 7:
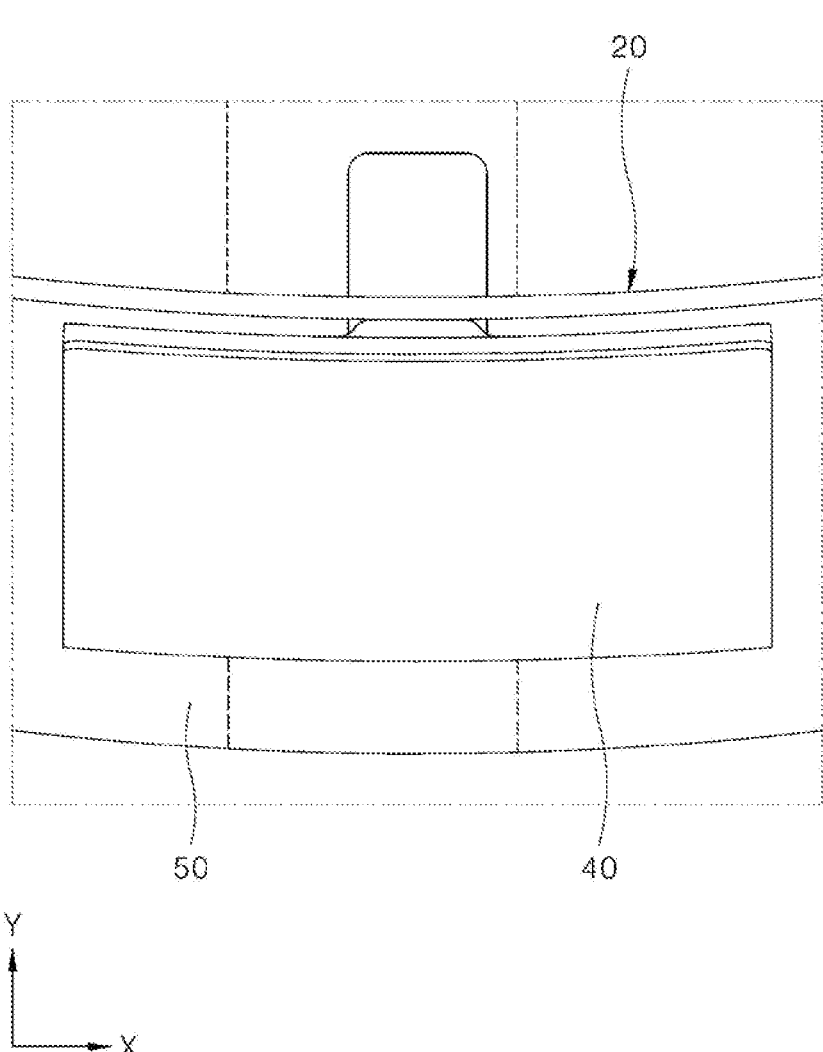
FIG. 7 is an enlarged view of the central area of the display apparatus as shown in FIG. 6.
Figure 8:
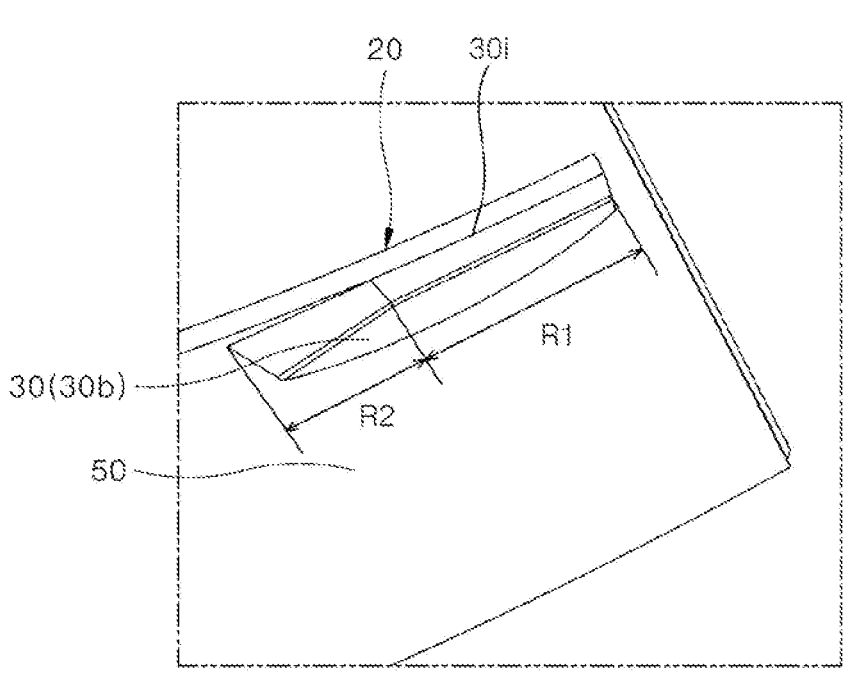
FIG. 8 is an enlarged view of the edge area of the display apparatus as shown in FIG. 6.
Figure 8:
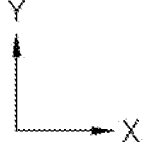

FIG. 5 is a perspective view showing a state in which a display apparatus according to an embodiment of the present disclosure is in a curved mode. FIG. 6 is a plan view illustrating a state in which a display apparatus according to an embodiment of the present disclosure is in a curved mode. FIG. 7 is an enlarged view of the central area of the display apparatus as shown in FIG. 6. FIG. 8 is an enlarged view of the edge area of the display apparatus as shown in FIG. 6.

When the display apparatus 10 is in the curved mode, for example, when the display panel 20 has a curved shape, the central support assembly 40 can move so as to be closer to the rear surface of the main body 50. As the central support assembly 40 moves so as to be closer to the rear surface of the main body 50, the curvature of the display panel 20 can further increase. When the central support assembly 40 is positioned at the closest position to the rear surface of the main body 50 within a movement range, the display panel 20 can have the maximum curvature. The maximum curvature of the display panel 20 can be equal to the first curvature of the front surface of the main body 50. When the first curvature of the front surface of the main body 50 is equal to the second curvature of the rear surface of the main body 50, the maximum curvature of the display panel 20 can be equal to each of the first curvature of the front surface and the second curvature of the rear surface of main body 50. For example, the main body 50 can maintain a predetermined curvature in the curved mode and in the flat mode of the display apparatus 10, and can remain fixed while the display apparatus 10 moves and changes change (e.g., changes its curvature).

As the central support assembly 40 is positioned closer to the rear surface of the main body 50, the left and right edge support assemblies 30a and 30b can rotate by a larger amount, and can move horizontally by a larger amount. The left edge support assembly 30a and the right edge support assembly 30b can rotate in opposite directions. Referring to FIG. 6, as the curvature of the display panel 20 increases, the left edge support assembly 30a can rotate clockwise and the right edge support assembly 30b can rotate counterclockwise. As the curvature of the display panel 20 increases, the left edge support assembly 30a and the right edge support assembly 30b can move horizontally (e.g., in a lateral direction of the display panel 20) so that a straight line distance therebetween becomes smaller.

Referring to FIG. 7, the front surface 40i of the central support assembly 40 facing the display panel 20 can have the coupling portion 40c that protrudes toward the rear surface of the display panel 20 and is coupled to the rear surface of the display panel 20. The front surface 40i of the central support assembly 40 is a curved surface with a predetermined curvature. Thus, when the display apparatus 10 is in the curved mode, for example, when the display panel 20 has a curved shape, each of both opposing side ends of the front surface 40i of the central support assembly 40 can be spaced apart from the rear surface of the display panel 20. As the curvature of the display panel 20 increases, the distance by which each of both opposing side ends of the front surface 40i of the central support assembly 40 is spaced from the rear surface of the display panel 20 can increase. The curvature of the front surface 40i of the central support assembly 40 can be equal to the maximum curvature of the display panel 20.

Referring to FIG. 8, when the display apparatus 10 is in the curved mode, for example, when the display panel 20 has the curved shape, only a portion of the front surface 30i of the right edge support assembly 30b, for example, only a first area R1 of the front surface 30i disposed adjacent to the side edge of the display panel 20 can be attached or coupled to the rear surface of the display panel 20. The remaining portion of the front surface 30i of the right edge support assembly 30b, for example, a second area R2 of the front surface 30i spaced apart from the side edge of the display panel 20 can be spaced apart from the rear surface of the display panel 20. A width of the first area R1 of the front surface 30i of the right edge support assembly 30b can be as uniform as the right edge support assembly 30b extends from the top to the bottom of the right edge support assembly 30b. In FIG. 8, the description has been made above with reference to the right edge support assembly 30b. However, the above description can be equally or similarly applied to the left edge support assembly 30a.

As described above, in order to stably support the edge of the display panel 20, the edge support assembly 30 has a shape in which the width thereof increases and the thickness thereof increases as the edge support assembly 30 extends from the top to the bottom thereof. The front surface 30i of the edge support assembly 30 can be flat and have a lower width thereof is larger than an upper width thereof. Thus, when an entirety of the front surface 30i of the edge support assembly 30 is attached or coupled to the rear surface of the display panel 20, a curvature of an upper edge and a curvature of a lower edge of the display panel 20 may not be equal to each other. When the entirety of the front surface 30i of the edge support assembly 30 is attached or coupled to the rear surface of the display panel 20, a flat area in the lower edge of the display panel 20 can be larger than a flat area in the upper edge of the display panel 20.

Therefore, only the first area R1 of the front surface 30i of the edge support assembly 30 can be attached or coupled to the rear surface of the display panel 20, and the second area R2 of the front surface 30i of the edge support assembly 30 can be spaced apart from the rear surface of the display panel 20. Thus, at the edge of the display panel 20, the curvature of the upper edge of the display panel 20 and the curvature of the lower edge of the display panel 20 can be prevented from being different from each other.

Figure 9:
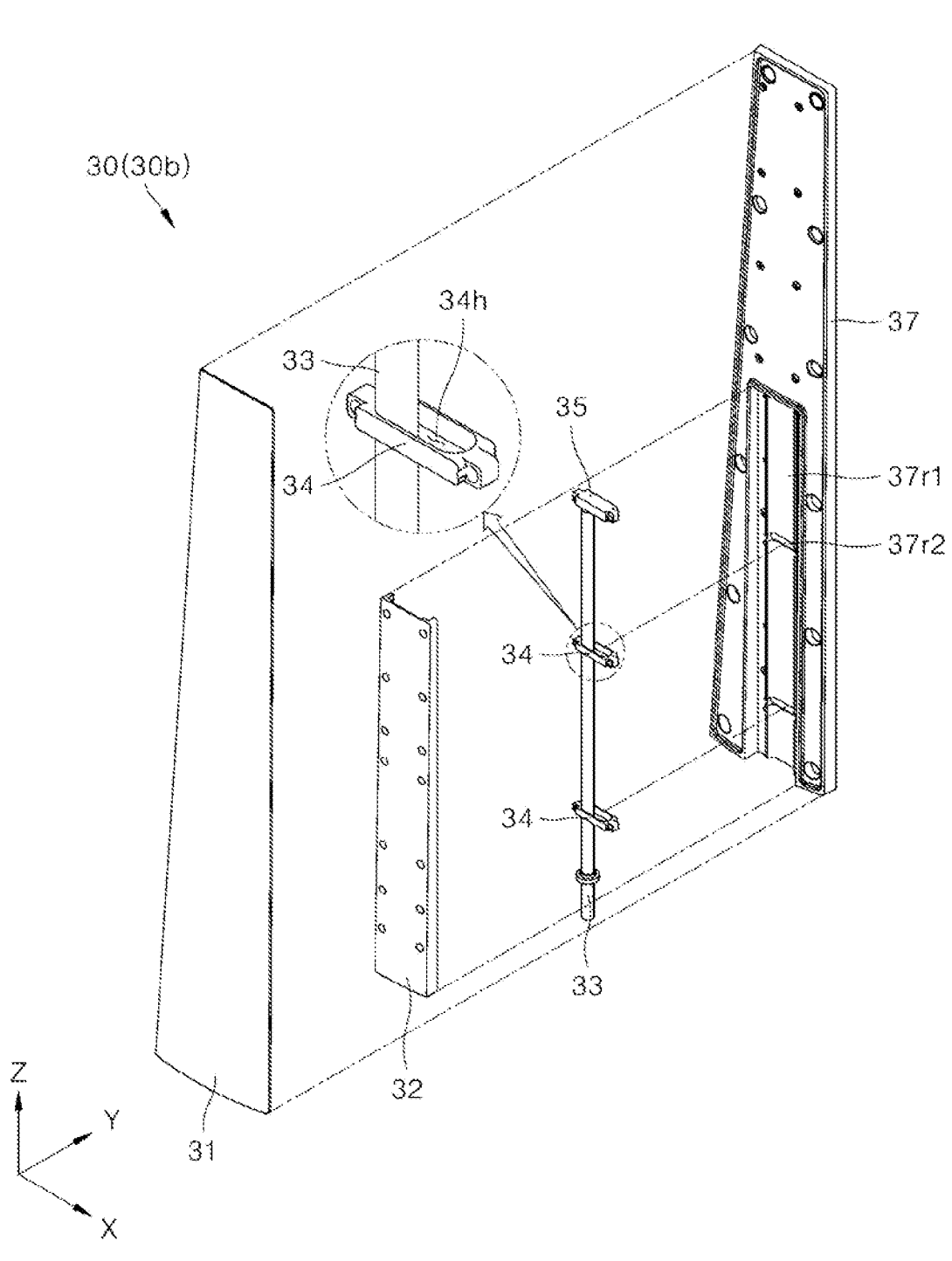
FIG. 9 is an exploded perspective view of an edge support assembly of a display apparatus according to an embodiment of the present disclosure.

FIG. 9 is an exploded perspective view of an edge support assembly of a display apparatus according to an embodiment of the present disclosure.

Referring to FIG. 9, the edge support assembly 30 can include an edge cover 31, an edge frame cover 32, a rigid bar 33, at least one ring member 34, a cap member 35, and an edge support frame 37.

At least a portion of the edge support frame 37 can be attached to the rear surface of the display panel 20, and a receiving groove 37r can be defined in a surface opposite to an attachment surface of the edge support frame 37. Within the receiving groove 37r of the edge support frame 37, the rigid bar 33, at least one ring member 34 fitted around the rigid bar 33, and the cap member 35 covering at a top of the rigid bar 37 can be disposed. Two ring members 34 are shown in FIG. 9, however, more than three ring members 34 can be used and attached to the rigid bar 33. The rigid bar 33 can have a circular cross-sectional shape, so as to be a circular rod, however, the rigid bar 33 can also have any cross-sectional shape, such as a square, rectangle or the like. The edge frame cover 32 can cover the receiving groove 37r of the edge support frame 37 to protect the rigid bar 33, the ring member 34 and the cap member 35 such that the rigid bar 33, the ring member 34 and the cap member 35 are maintained within the receiving groove 37r. At least one ring member 34 can include two ring members as shown in FIG. 9. However, the present disclosure is not limited thereto. The receiving groove 37r can have a length smaller than a total length of the edge support frame 37. The receiving groove 37r can include a first receiving groove 37r1 in which the edge frame cover 32 is accommodated (e.g., positioned), and a second receiving grooves 37r2 in which at least the ring member 34 and the cap member 35 are accommodated. Due to the presence of the second receiving groove 37r2, the ring member 34 and the cap member 35 can be easily mounted. Moreover, disposing the ring member 34 and the cap member 35 in the second receiving groove 37r2 can allow the ring member 34 and the cap member 35 to be maintained at a level state and stably in using the display apparatus 10. The rigid bar 33 can stand in a vertical direction with respect to an upper surface of the main body 50 of the display apparatus 10, and the ring member 34 can be oriented in a direction perpendicular to a direction in which the rigid bar 33 extends, for example, can be oriented in a horizontal direction. The rigid bar 33 can have a circular cross-section. The ring member 34 can have a through-hole 34h defined therein having a length greater than a diameter of the rigid bar 33. Therefore, while the curvature of the display panel 20 is changed as the central support assembly 40 moves forward and backward, the ring member 34 can rotate with respect to the rigid bar 33 and can move in the horizontal direction at the same time.

Each of the rigid bar 33, the ring member 34 and the cap member 35 can be made of a metal material. For example, each of the rigid bar 33, the ring member 34 and the cap member 35 can be made of aluminum or aluminum alloy. Each of the edge support frame 37, the edge frame cover 32 and the edge cover 31 can be made of, for example, a metal material or a plastic material. Further, the edge frame cover 32 can be provided with one or more holes/grooves for attachment of the edge frame cover 32 to the edge support frame 37.

Figure 10:
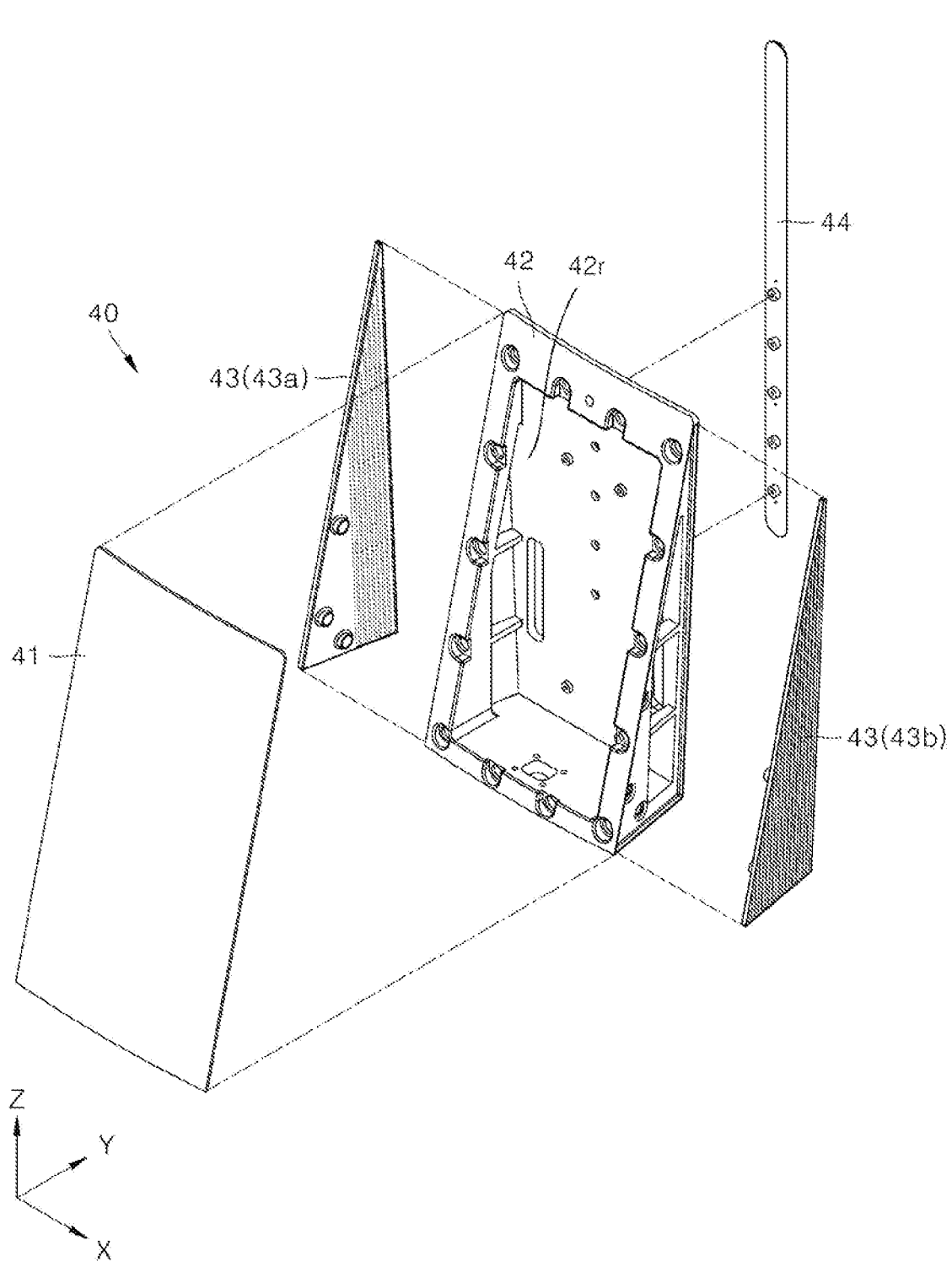
FIG. 10 is an exploded perspective view of a central support assembly of a display apparatus according to an embodiment of the present disclosure.
Figure 11:
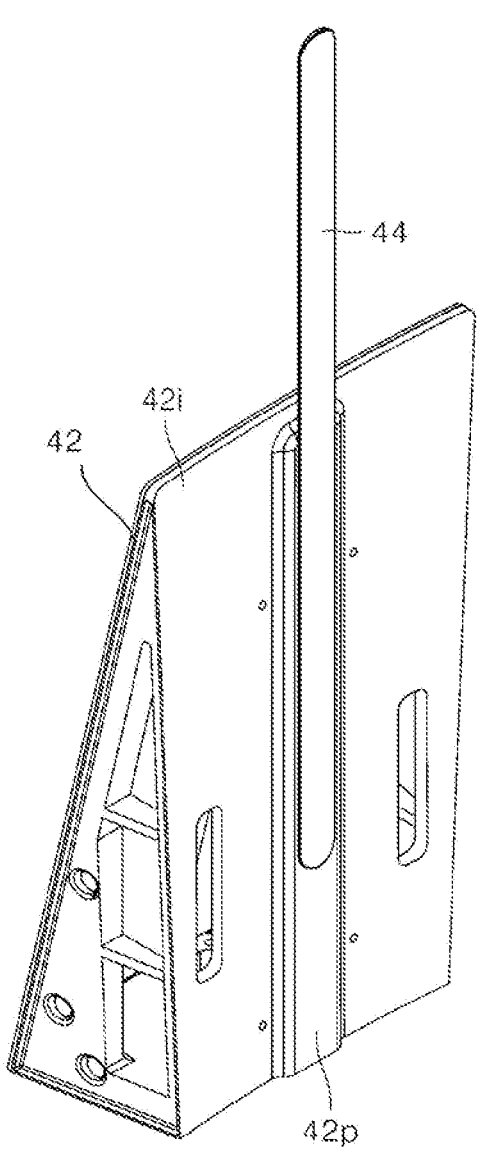
FIG. 11 is a perspective view of only some components of the central support assembly of the display apparatus according to an embodiment of the present disclosure.
Figure 11:
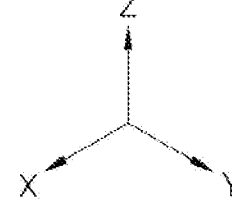

FIG. 10 is an exploded perspective view of a central support assembly of a display apparatus according to an embodiment of the present disclosure. FIG. 11 is a perspective view of only some components of the central support assembly of the display apparatus according to an embodiment of the present disclosure.

The central support assembly 40 can include a central support frame 42 having a receiving space 42r for accommodating therein a timing controller of the display panel 20, a central support bar 44 having one side coupled to the central support frame 40 and the other side coupled to the rear surface of the display panel 20, a central cover 41 covering the receiving space 42r of the central support frame 42, and side covers 43 respectively covering both opposing sides of the central support frame 42.

The central support frame 42 has a shape in which a thickness increases as the central support frame 42 extends from a top to a bottom thereof. The linear driver 57 of the main body 50 can be coupled to a lower portion of the central support frame 42.

The side covers 43 include a plurality of slits to easily dissipate heat generated in the timing controller to the outside. The side covers 43 can include a plurality of protrusions, as shown in FIG. 10, that engage corresponding grooves/holes of the central support frame, to attach the side covers to the central support frame 42.

The central support frame 42 can include a protrusion 42p protruding towards the display panel 20. One side of the central support bar 44 can be coupled to the protrusion 42p of the central support frame 42. The central support frame 42 can be coupled to the rear surface of the display panel 20 via the central support bar 44. The protrusion 42p of the central support frame 42, and the central support bar 44 can constitute the coupling portion 40c of the central support assembly 40 in FIG. 3. A first side of the central support bar can be slidably coupled to the protrusion 42p of the central support frame 42.

The central support bar 44 can have a width smaller than that of the protrusion 42p of the central support frame 42. As the central support assembly 40 is coupled to the display panel 20 via the narrow central support bar 44, the curvature of the central area of the display panel 20 can be formed naturally.

The central support bar 44 can have a length equal to or smaller than a height of the rear surface of the display panel 20, for example, a length from the top to the bottom of the display panel 20. For example, referring to FIG. 1, the central support bar 44 can have a length smaller than the height of the rear surface of the display panel 20, for example, the length from the top to the bottom of the display panel 20. The central support bar 44 can extend from an area adjacent to the top of the display panel 20 to an area adjacent to the bottom of the display panel 20. Thus, a curvature of a center of an upper portion of the display panel 20 and a curvature of a center of a lower portion of the display panel 20 can be equal to each other.

The central support bar 44 can be made of a hard and high-strength material, such as a metal material. The central support bar 44 can be made of a metal material, for example, such as stainless steel. Each of the central support frame 42, the central cover 41 and the side covers 43 can be made of, for example, a metal material or a plastic material. The central support bar 44 can be provided with a plurality of protrusions, as shown in FIG. 10, and the plurality of protrusions can allow for attachment of the central support bar 44 to the central support frame 42, such as by fasteners or the like. Additionally, the plurality of protrusions of the central support bar 44 can have an internal thread for receiving a threaded fasteners, such as a screw or bolt, which can be used to attach the central support bar 44 to the central support frame 42.

Figure 12:
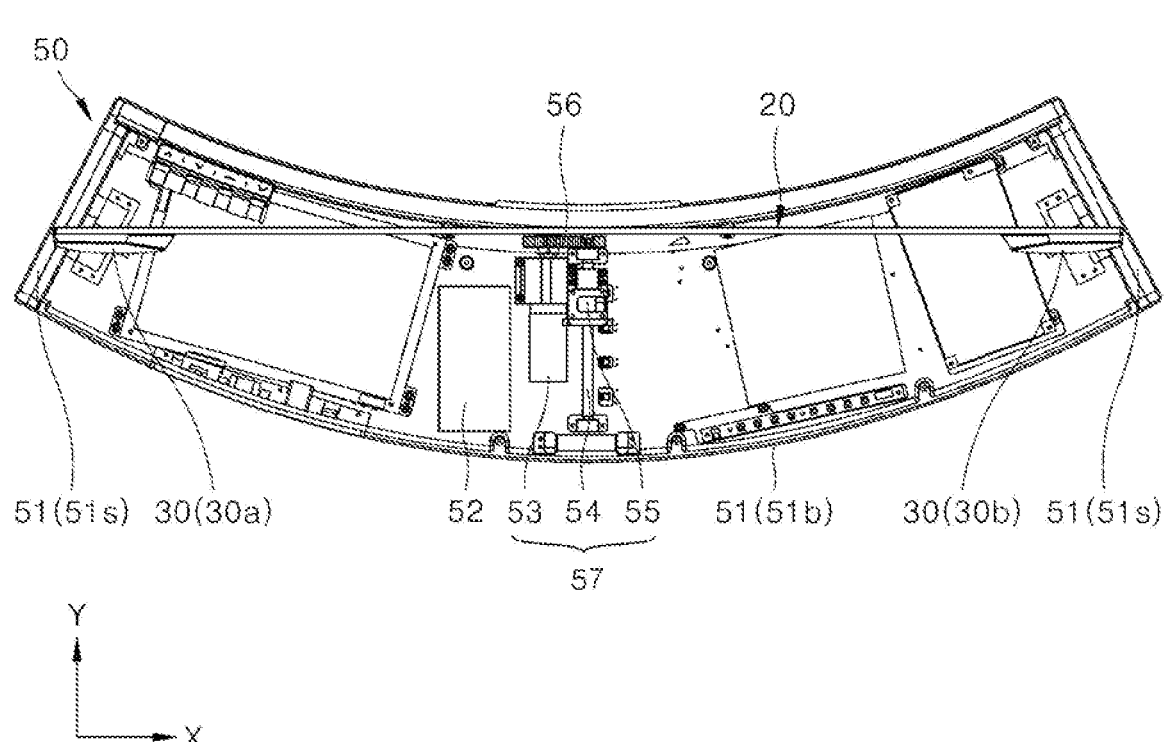
FIG. 12 is a plan view showing an operating state of a linear driver connected to the central support assembly when the display apparatus is in the flat mode, as shown in FIG. 1.
Figure 13:
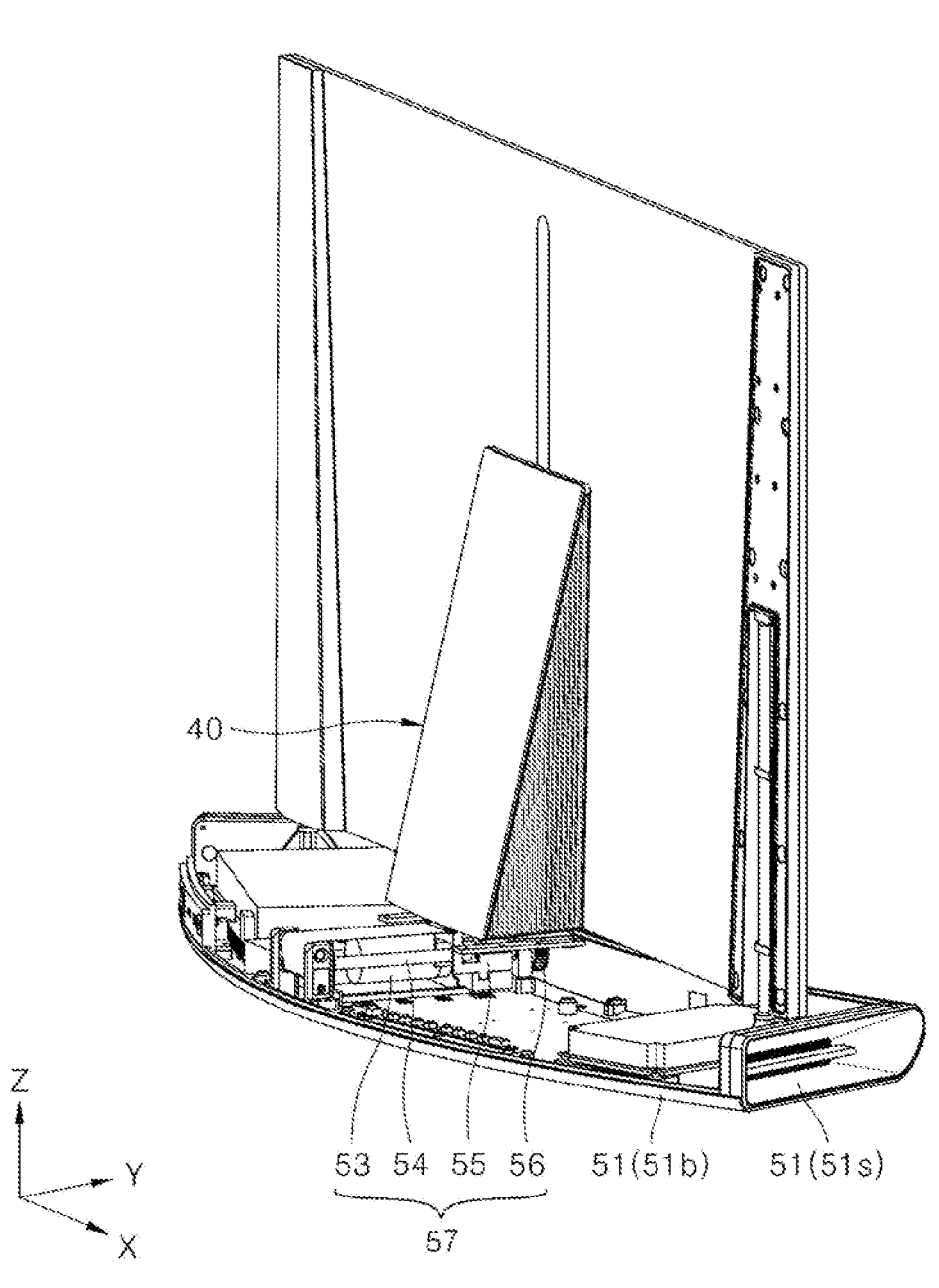
FIG. 13 is a perspective view showing an operating state of a linear driver connected to the central support assembly when the display apparatus is in the flat mode, as shown in FIG. 2.
Figure 14:
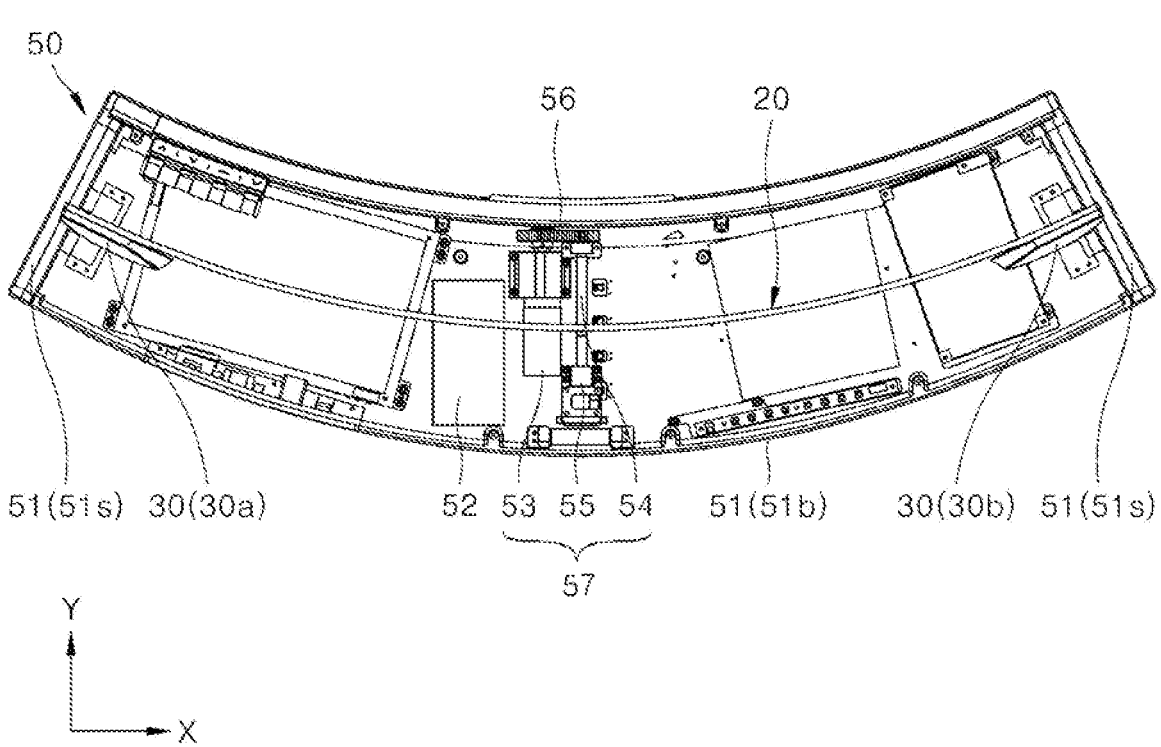
FIG. 14 is a plan view showing an operating state of the linear driver connected to the central support assembly when the display apparatus is in the curved mode, as shown in FIG. 5.
Figure 15:
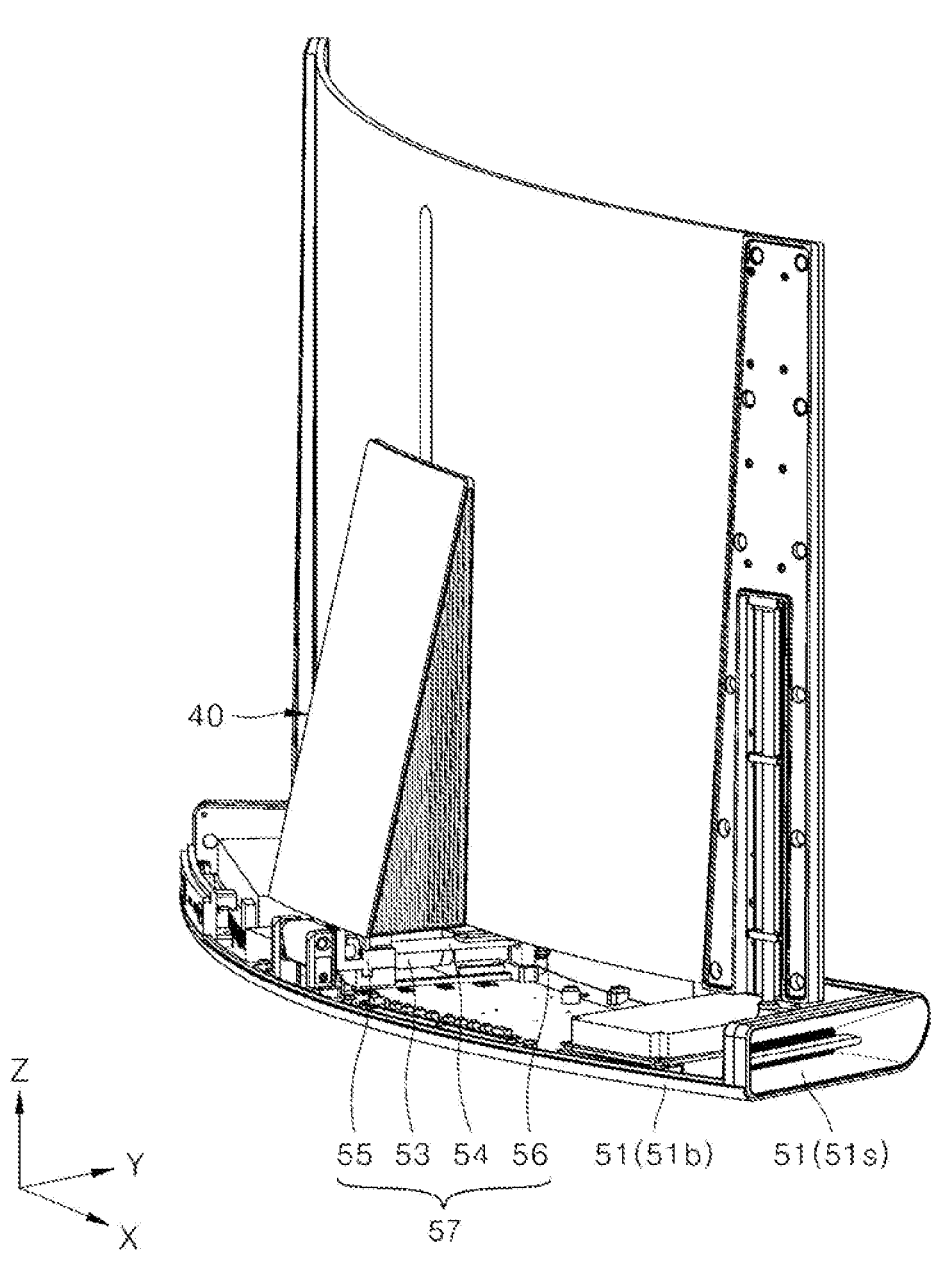
FIG. 15 is a perspective view showing an operating state of the linear driver connected to the central support assembly when the display apparatus is in the curved mode, as shown in FIG. 6.

FIG. 12 and FIG. 13 are a plan view and a perspective view showing an operating state of the linear driver connected to the central support assembly when the display apparatus is in the flat mode as shown in FIG. 1 and FIG. 2, respectively. FIG. 14 and FIG. 15 are a plan view and a perspective view showing the operating state of the linear driver connected to the central support assembly when the display apparatus is in the curved mode as shown in FIG. 5 and FIG. 6, respectively.

Referring to FIG. 12 and FIG. 13, the main body 50 can include a casing 51 that constitutes an exterior appearance thereof, a motor controller 52 that controls a motor, and the linear driver 57 that moves the central support assembly. The linear driver 57 can include a lead screw 54, a motor 53 for rotating the lead screw 54, a nut bracket 55 movably coupled to the lead screw 54, and a gear 56 connecting the motor 53 and the lead screw 54 to each other. The motor controller 52 can be a hardware-embedded processor that controls the motor 53, or any type of controller, as known in the art.

The motor controller 52 can operate the motor 53 according to a signal input by buttons provided on the casing 51 of the main body 50. The user can press or touch the button of the main body 50 to operate the motor 53 to change the curvature of the display panel 20. An operating time of the motor 53 can be adjusted according to a time duration for which or the number of times the user presses or touches the button. Accordingly, the curvature of the display panel 20 can be changed in several steps or continuously.

As a shaft of the motor 53 rotates, the nut bracket 55 can move forward and backward. The rotation of the shaft of the motor 53 is transmitted to the lead screw 54 via the gear 56 so that the lead screw 54 can rotate. The gear 56 can be, for example, a spur gear. The nut bracket 55 includes a nut that engages the lead screw 54, and thus can move forward and backward according to the rotation of the lead screw 54.

An upper portion of the nut bracket 55 of the linear driver 57 is coupled to a lower portion of the central support frame 42. Thus, as the nut bracket 55 moves, the central support frame 42 or the central support assembly 40 can move by the same distance in the same direction. Therefore, the curvature of the display panel 20 can be changed according to the movement of the central support assembly 40.

The casing 51 can include an upper casing, a lower casing 51*b* and, side casings 51*s*. In FIG. 12 to FIG. 15, the upper casing is omitted to show an inner structure of the main body 50. The linear driver 57 can be positioned within the casing 51. The linear driver 57 can be positioned on the lower casing 51*b*.

When the display apparatus 10 is in the flat mode, for example, the display panel 20 has the flat shape, the nut bracket 55 connected to the central support frame 42 or the central support assembly 40 can be located adjacent to a front surface of the main body 50.

When the display apparatus 10 is used as a monitor or a television, the main body 50 can include embedded parts for outputting power and a video signal to the display panel 20, and a speaker.

When the display apparatus 10 is used as an all-in-one PC, the main body 50 includes not only the embedded parts for outputting power and a video signal to the display panel 20 but also various processing units such as CPU and GPU, a memory device, a wired/wireless network device, a speaker, etc.

Referring to FIG. 14 and FIG. 15, when the display apparatus 10 is in the curved mode, for example, the display panel 20 has the curved shape, the nut bracket 55 connected to the central support frame 42 or the central support assembly 40 can be located adjacent to the rear surface of the main body 50.

Figure 16:
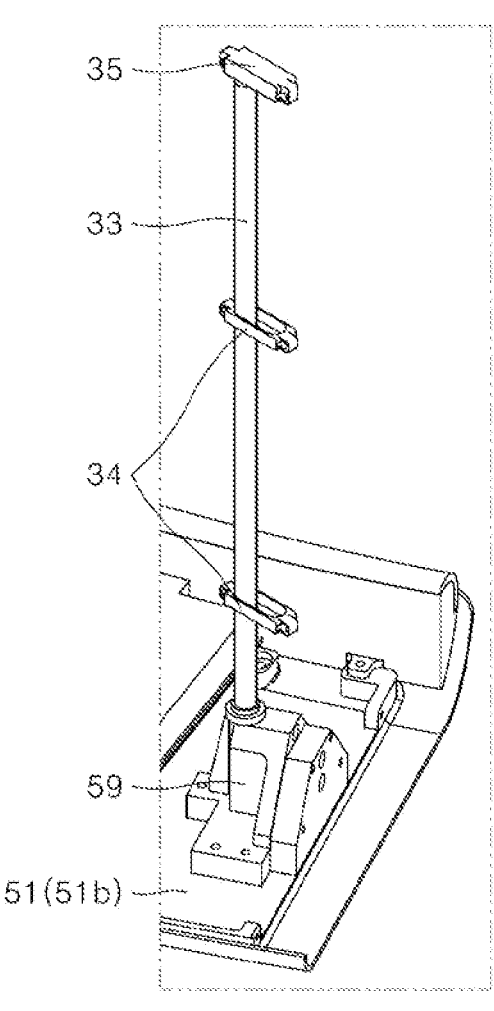
FIG. 16 is a perspective view showing a rigid bar and ring member of the edge support assembly when the display apparatus is in flat mode.
Figure 17:
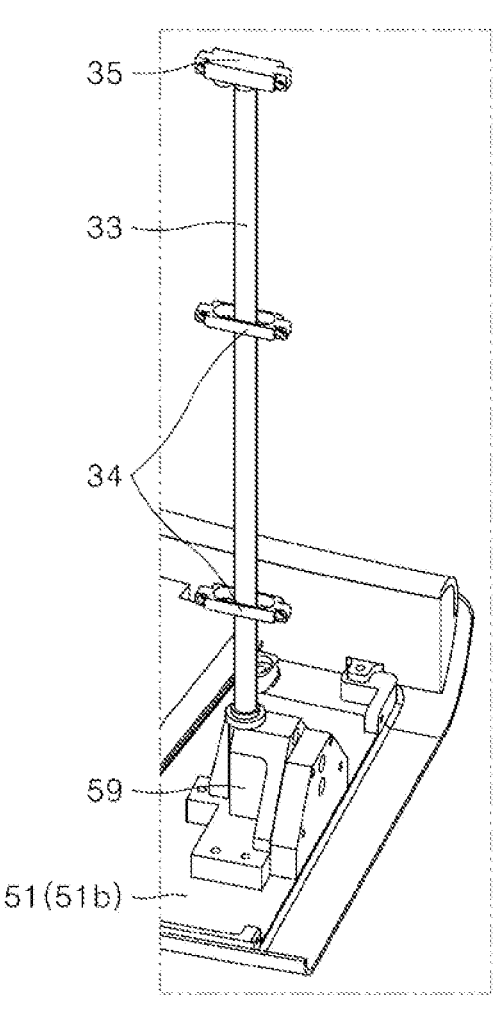
FIG. 17 is a perspective view showing the rigid bar and a ring member of the edge support assembly when the display apparatus is in the curved mode.

FIG. 16 is a perspective view showing the rigid bar and the ring member of the edge support assembly when the display apparatus is in the flat mode. FIG. 17 is a perspective view showing the rigid bar and the ring member of the edge support assembly when the display apparatus is in the curved mode.

Referring to FIG. 16 and FIG. 17, as described above, the rigid bar 33 can have a circular cross section. The ring member 34 includes the through-hole 34*h* (shown in FIG. 9) with a length greater than the diameter of the rigid bar 33. The rigid bar 33 can be fixed to a securing member 59 mounted on the lower casing 51*b*. Therefore, in the process of changing the curvature of the display panel as the central support assembly moves frontwards and rearwards, the ring member 34 rotates with respect to the rigid bar 33 and can move in the horizontal direction at the same time. The securing member 59 can be a clamp that engages an outer surface of the rigid bar 33.

The cap member 35 has a groove defined therein corresponding to the through-hole of the ring member 34. Thus, in the process of changing the curvature of the display panel as the central support assembly moves forward and backward, the cap member 35 can rotate with respect to the rigid bar 33 and can move in the horizontal direction at the same time.

Figure 18:
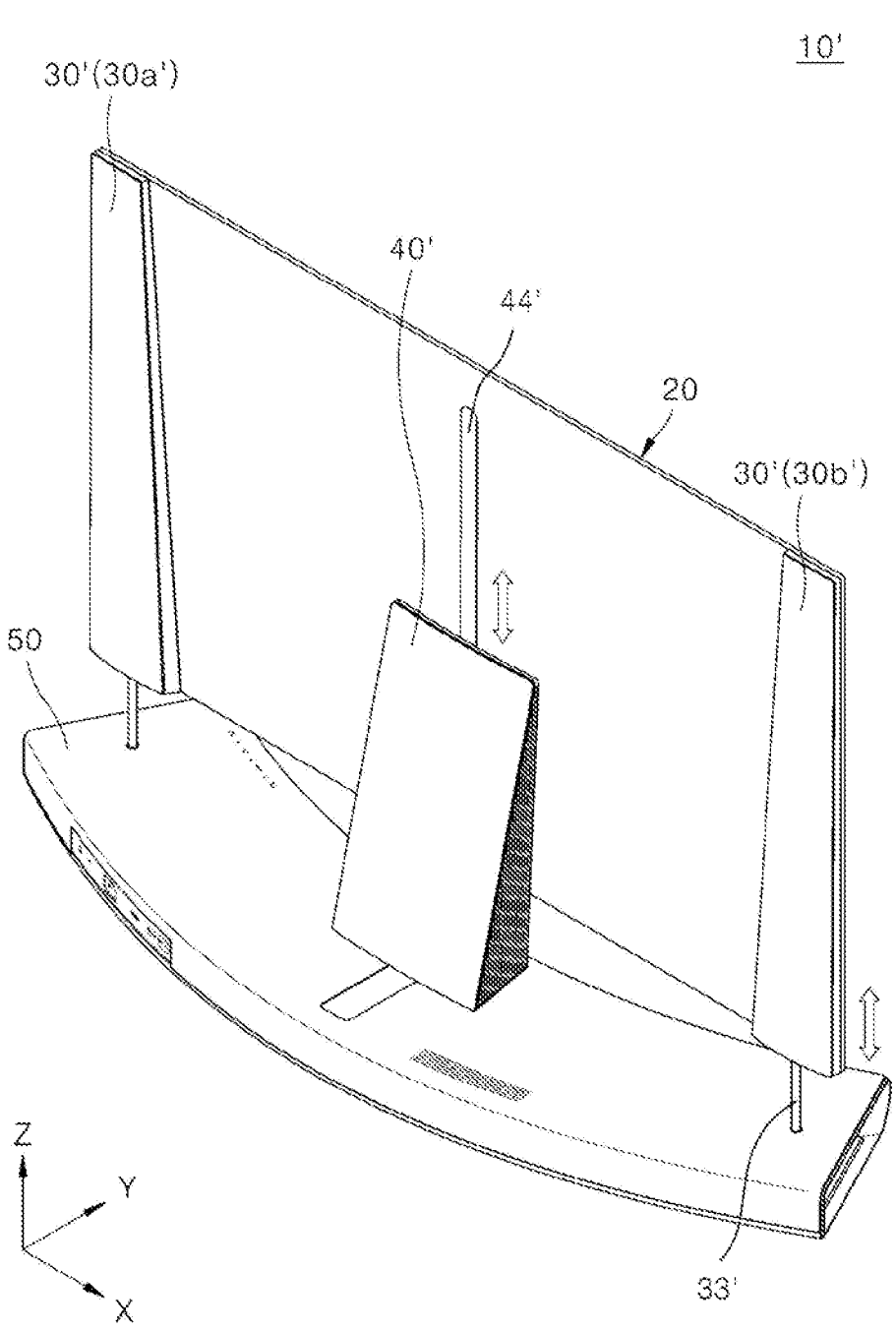
FIG. 18 is a perspective view showing a display apparatus according to an embodiment of the present disclosure in which a display panel can move up and down.
Figure 19:
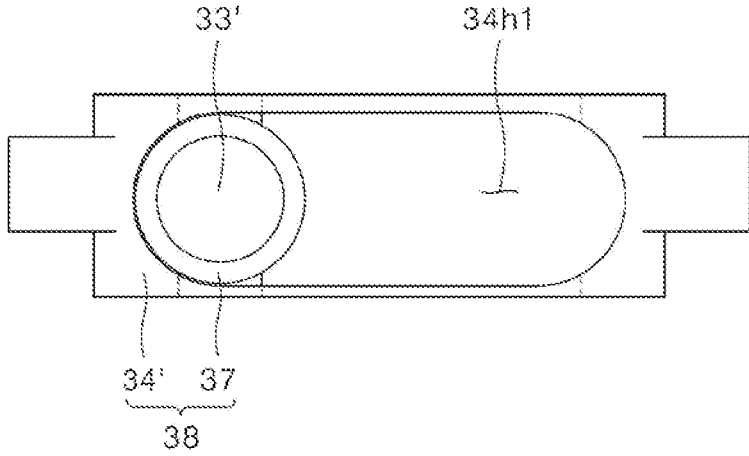
FIG. 19 is a plan view showing some components of the edge support assembly of the display apparatus according to the embodiment as shown in FIG. 18.
Figure 20:
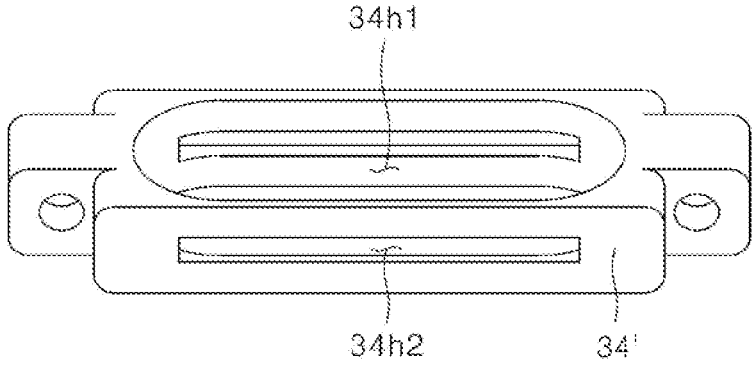
FIG. 20 is a perspective view showing an outer ring member of a ring assembly as shown in FIG. 19.
Figure 21:
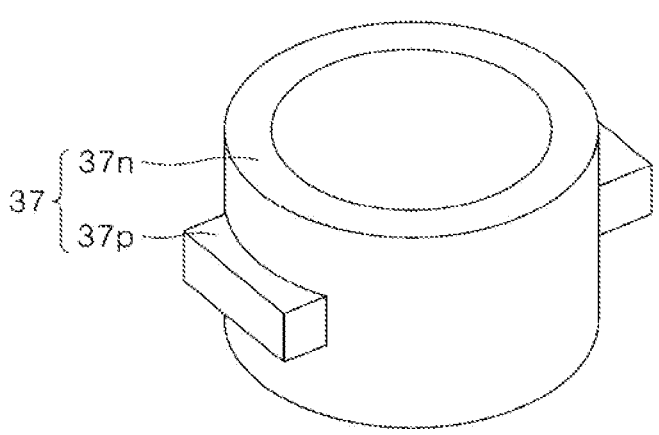
FIG. 21 is a perspective view showing an inner ring member of the ring assembly as shown in FIG. 19.

FIG. 18 a perspective view showing a display apparatus according to an embodiment of the present disclosure in which the display panel can move up and down. FIG. 19 is a plan view showing some components of the edge support assembly of the display apparatus according to the embodiment as shown in FIG. 18. FIG. 20 is a perspective view showing an outer ring member of the ring assembly as shown in FIG. 19. FIG. 21 is a perspective view showing an inner ring member of the ring assembly as shown in FIG. 19.

A display apparatus 10' as shown in FIG. 18 is different from the display apparatus 10 as shown in FIG. 1 in that the display panel 20 in the display apparatus 10' can move in a vertical direction.

Hereinafter, components for moving the display panel 20 of the display apparatus 10' as shown in FIG. 18 in the vertical direction will be mainly described.

Referring to FIG. 18, the display apparatus 10' includes a central support assembly 40' and edge support assemblies 30'.

In this embodiment, some components of the central support assembly 40' are movable relative to the other components thereof. For example, a central support bar 44' of the central support assembly 40' can move vertically relative to the remaining components thereof. Therefore, a length of the central support assembly 40' can be lengthened or shortened.

In this embodiment, some components of the edge support assembly 30' are movable relative to the other components thereof. For example, the remaining components of the edge support assembly 30' are movable in the vertical direction with respect to the rigid bar 33' of the edge support assembly 30'. Accordingly, the length of the edge support assembly 30' can be lengthened or shortened.

Referring to FIG. 19 to FIG. 21, a ring assembly 38 can include an outer ring member 34' and an inner ring member 37. A rigid bar 33' can be a lead screw. The inner ring member 37 can include a nut 37*n* and a protrusion 37*p*. For example, two protrusions 37*p* can be positioned on an outer surface of the nut 37*n*. The inner ring member 37 can be fitted around the rigid bar 33'. The rigid bar 33' can move vertically along the rigid bar 33' by the rotation of the rigid bar 33'. The outer ring member 34' can have a first through-hole 34*h*1 and a second through-hole 34*h*2 so that the inner ring member 37 can move inside the outer ring member 34'.

The first through-hole 34h1 can extend through upper and lower surfaces of the outer ring member 34', and the second through-hole 34h2 can extend through a side surface of the outer ring member 34'. The second through-hole 34h2 can be connected to the first through-hole 34h1 and can accommodate therein the protrusion 37p of the inner ring member 37 accommodated in the outer ring member 34'. For example, the inner ring member 37 can include two protrusions 37p, and each of the two protrusions 37p can be positioned within a respective one of the first and second through-holes 34h1 and 34h2.

A shape of the inner ring member 37 is not limited to that as shown in FIG. 19 to FIG. 21. For example, the inner ring member 37 can include a protrusion extending continuously along and on the outer surface of the nut 37n.

Figure 22:
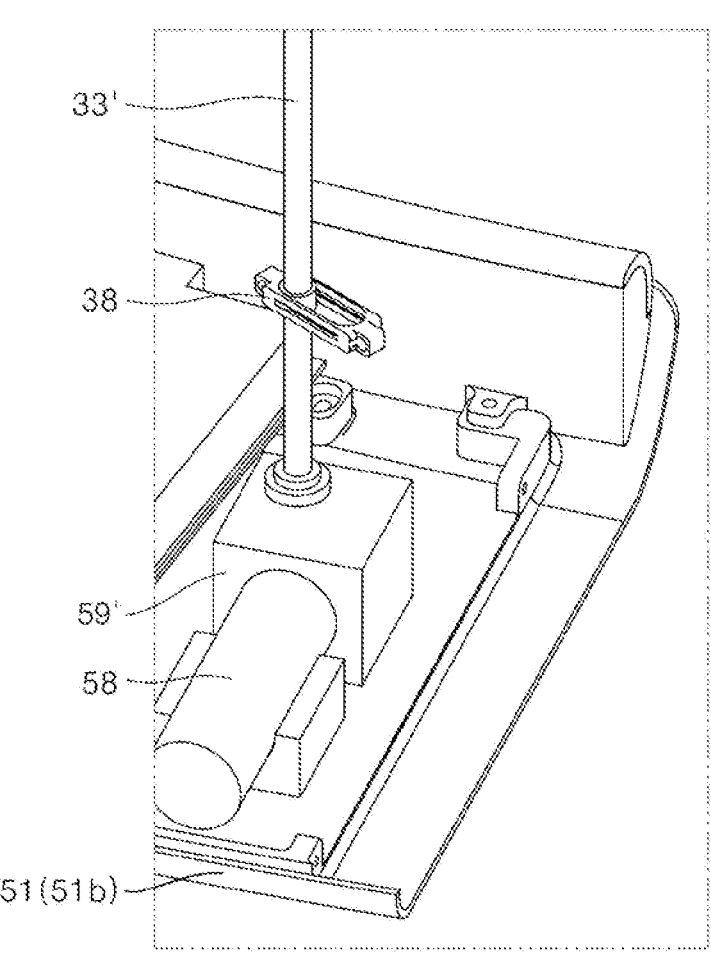
FIG. 22 is a perspective view for illustrating some components of the edge support assembly of the display apparatus according to the embodiment as shown in FIG. 18 and a vertically driving structure connected thereto.

FIG. 22 is a perspective view for illustrating some components of the edge support assembly of the display apparatus according to the embodiment as shown in FIG. 18 and a vertically driving structure connected thereto.

Referring to FIG. 22, the rigid bar 33' can be connected to a gearbox 59 disposed on the lower casing 51b, and the motor 58 can be connected to the gear box 59. The gear box 59 can include a bevel gear or a worm gear. The shaft of the motor 58 and the rigid bar 33' are coupled to each other via the gear box 59. Thus, the rigid bar 33' can rotate as the shaft of the motor 58 rotates. As the rigid bar 33' as the lead screw rotates, the ring assembly 38 can move up and down along the rigid bar 33'.

Figure 23:
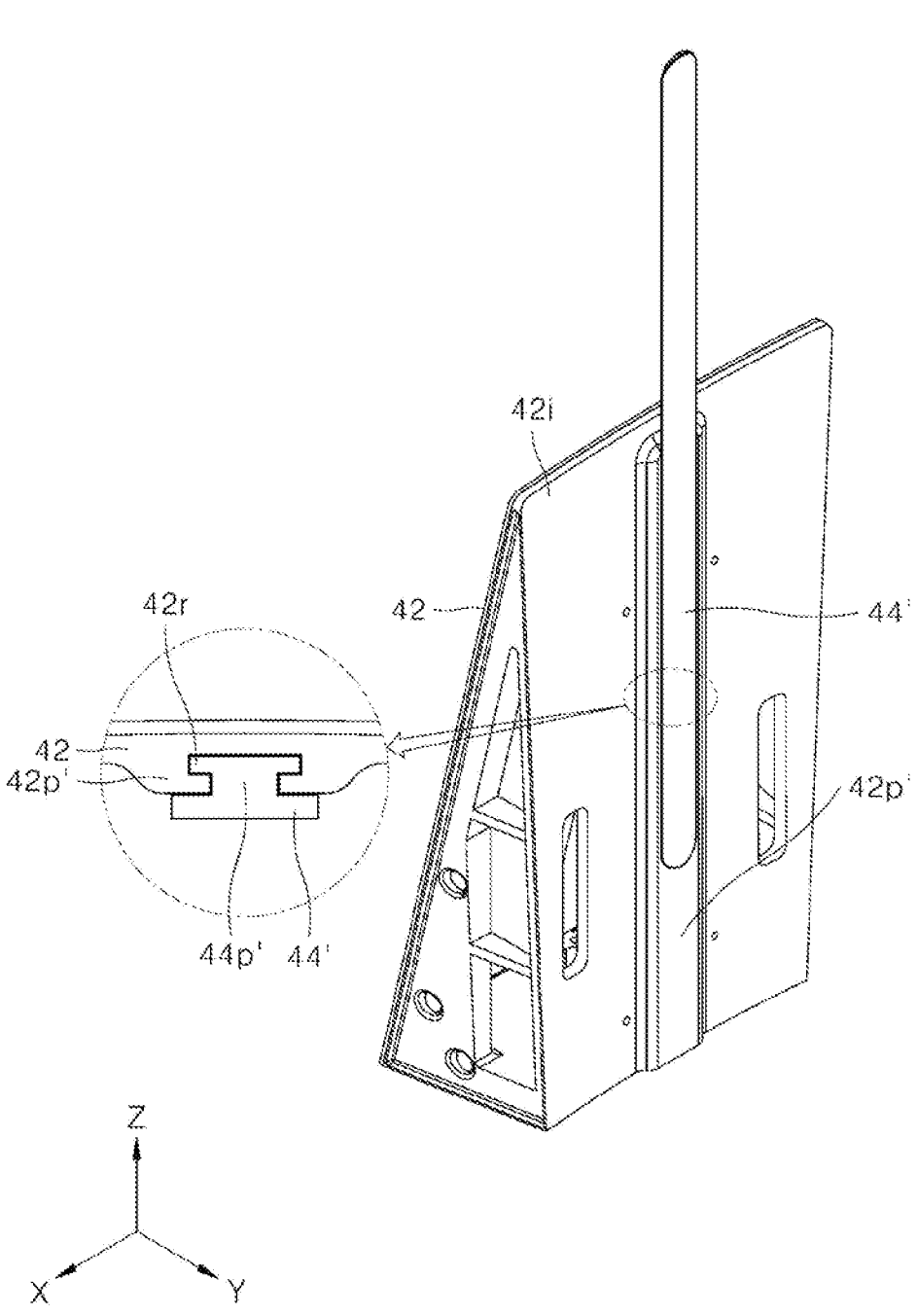
FIG. 23 is a perspective view showing some components of the central support assembly of the display apparatus according to the embodiment as shown in FIG. 17.

FIG. 23 is a perspective view showing some components of the central support assembly of the display apparatus according to the embodiment as shown in FIG. 18.

Referring to FIG. 23, the central support bar 44' can be slidably coupled to a central support frame 42'. A protrusion 44p' of the central support bar 44' can be slidably inserted into a groove 42r formed in a protrusion 42p' of the central support frame 42'.

Therefore, as the display panel 20 moves up, the central support bar 44' can move up relative to the central support frame 42'.

When the ring assembly 38 moves up along the rigid bar 33' by the rotation of the rigid bar 33', the remaining components of the edge support assembly 30' except for the rigid bar 33' move up. Accordingly, the display panel 20 moves up with respect to the main body 50.

A display apparatus according to embodiments of the present disclosure can be described as follows.

A first aspect of the present disclosure provides a display apparatus comprising: a flexible display panel, a central support assembly supporting a central portion of the display panel and coupled to a rear surface of the display panel, two edge support assemblies respectively supporting both opposing side edges of the display panel and coupled to the rear surface of the display panel, and a main body supporting the central support assembly and the edge support assemblies, wherein the central support assembly moves frontwards and rearwards along an opening defined in a central portion of the main body.

In some implementations of the first aspect, the edge support assemblies rotate in opposite directions to each other as the central support assembly moves frontwards and rearwards.

In some implementations of the first aspect, the edge support assemblies rotate and move in a horizontal direction at the same time as the central support assembly moves frontwards and rearwards.

In some implementations of the first aspect, the central support assembly includes: a central support frame accommodating therein a timing controller of the display panel, and a central support bar having one side coupled to the central support frame and the other side coupled to the rear surface of the display panel.

In some implementations of the first aspect, the central support frame includes a protrusion protruding toward the display panel, wherein the one side of the central support bar is coupled to the protrusion of the central support frame.

In some implementations of the first aspect, the one side of the central support bar is slidably coupled to the protrusion of the central support frame, so that a length of the central support assembly is changed.

In some implementations of the first aspect, the main body includes a linear driver coupled to a lower portion of the central support assembly, wherein the linear driver is configured to move the central support assembly frontwards and rearwards.

In some implementations of the first aspect, the linear driver includes: a lead screw extending in frontward and rearward directions of the main body, a motor for rotating the lead screw, and a nut bracket movably coupled to the lead screw, wherein the nut bracket is coupled to the lower portion of the central support assembly.

In some implementations of the first aspect, each of the edge support assemblies includes: an edge support frame having at least a portion attached to the rear surface of the display panel, a rigid bar having a circular cross section, wherein the rigid bar is accommodated in a receiving groove of the edge support frame and is fixed to the main body, at least one ring member accommodated in the receiving groove of the edge support frame and fitted around the rigid bar, and a cap member accommodated in the receiving groove of the edge support frame, wherein the cap member covers a top of the rigid bar.

In some implementations of the first aspect, the at least one ring member has a through-hole defined therein having a length greater than a diameter of the rigid bar.

In some implementations of the first aspect, each of the edge support assemblies includes: an edge support frame having at least a portion attached to the rear surface of the display panel, a rigid bar as a lead screw accommodated in a receiving groove of the edge support frame and rotatably connected to the main body, at least one ring assembly accommodated in the receiving groove of the edge support frame and fitted around the rigid bar, and a cap member accommodated in the receiving groove of the edge support frame, wherein the cap member covers a top of the rigid bar, wherein by the rotation of the rigid bar, the at least one ring assembly moves up and down, such that a length of each of the edge support assemblies is changed.

In some implementations of the first aspect, the at least one ring assembly includes an outer ring member having a first through-hole defined therein, and an inner ring member accommodated in the first through-hole, wherein the outer ring member is rotatable and movable relative to the inner ring member.

In some implementations of the first aspect, the inner ring member includes a nut and at least one protrusion disposed on an outer circumferential surface of the nut, wherein the outer ring member further has a second through-hole defined therein, wherein the at least one protrusion of the inner ring member is accommodated in the second through-hole.

In some implementations of the first aspect, the main body further includes: a gear box connected to the rigid bar, and a motor connected to the gearbox.

A second aspect of the present disclosure provides a display apparatus comprising: a flexible display panel, a central support assembly supporting a central portion of the display panel and coupled to a rear surface of the display panel, and a main body having a linear driver coupled to a lower portion of the central support assembly, wherein the linear driver moves the central support assembly and a central portion of the display panel frontwards and rearwards along an opening defined in a central portion of the main body.

In some implementations of the second aspect, the display apparatus further comprises two edge support assemblies respectively supporting both opposing side edges of the display panel and coupled to the rear surface of the display panel.

In some implementations of the second aspect, the two edge support assemblies rotate in opposite directions to each other as the central support assembly moves frontwards and rearwards.

In some implementations of the second aspect, the two edge support assemblies rotate and move in a horizontal direction at the same time as the central support assembly moves frontwards and rearwards.

In some implementations of the second aspect, each of the central support assembly and the edge support assemblies are lengthened or shortened so as to change a height of the display panel.

Various embodiments described herein can be implemented in a computer-readable medium using, for example, software, hardware, or some combination thereof. For example, the embodiments described herein can be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, other electronic units designed to perform the functions described herein, or a selective combination thereof. In some cases, such embodiments are implemented by the controller. For Example, the controller is a hardware-embedded processor executing the appropriate algorithms (e.g., flowcharts) for performing the described functions and thus has sufficient structure. Also, the embodiments such as procedures and functions can be implemented together with separate software modules each of which performs at least one of functions and operations. The software codes can be implemented with a software application written in any suitable programming language. Also, the software codes can be stored in the memory and executed by the controller, thus making the controller a type of special purpose controller specifically configured to carry out the described functions and algorithms. Thus, the components shown in the drawings have sufficient structure to implement the appropriate algorithms for performing the described functions.

For a software implementation, the embodiments such as procedures and functions can be implemented together with separate software modules each of which performs at least one of functions and operations. The software codes can be implemented with a software application written in any suitable programming language. Also, the software codes can be stored in the memory and executed by the controller. Thus, the components shown in the drawings have sufficient structure to implement the appropriate algorithms for performing the described functions.

Although the embodiments of the present disclosure have been described in more detail with reference to the accompanying drawings, the present disclosure is not necessarily limited to these embodiments, and can be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects. The scope of protection of the present disclosure should be interpreted according to the scope of claims, and all technical ideas within an equivalent scope thereto should be interpreted as being included in the scope of rights of the present disclosure.

What is claimed is:

1. A display apparatus comprising:
   a flexible display panel;
   a central support assembly supporting a central portion of the flexible display panel and directly coupled to a rear surface of the flexible display panel;
   two edge support assemblies respectively supporting opposing sides of the flexible display panel, the two edge support assemblies being coupled to the rear surface of the flexible display panel; and
   a main body supporting the central support assembly and the two edge support assemblies, the main body including an opening in a central portion of the main body,
   wherein the central support assembly is configured to move along the opening of the main body,
   wherein the central support assembly has a greater thickness at a first end contacting the main body than a second end located away from the main body, and
   wherein the central support assembly is configured to contact the flexible display panel at both the first end contacting the main body and the second end located away from the main body.

2. The display apparatus of claim 1, wherein the two edge support assemblies rotate in opposite directions to each other as the central support assembly moves.

3. The display apparatus of claim 2, wherein the two edge support assemblies rotate and move in a horizontal direction at the same time as the central support assembly moves.

4. The display apparatus of claim 1, wherein the central support assembly includes:
   a central support frame configured to accommodate a timing controller of the flexible display panel; and
   a central support bar having a first side coupled to the central support frame and a second side coupled to the rear surface of the flexible display panel.

5. The display apparatus of claim 4, wherein the central support frame includes a protrusion extending toward the flexible display panel,
   wherein the first side of the central support bar is coupled to the protrusion of the central support frame.

6. The display apparatus of claim 5, wherein the first side of the central support bar is slidably coupled to the protrusion of the central support frame, and
   wherein the central support bar is configured to slide with respect to the protrusion of the central support frame to change a length of the central support assembly.

7. The display apparatus of claim 1, wherein the main body further includes a linear driver coupled to a lower portion of the central support assembly, and
   wherein the linear driver is configured to move the central support assembly.

8. The display apparatus of claim 7, wherein the linear driver includes:

a lead screw extending along the opening of the main body;

a motor configured to rotate the lead screw; and a nut bracket movably coupled to the lead screw, and wherein the nut bracket is coupled to the lower portion of the central support assembly.

9. The display apparatus of claim 1, wherein each of the two edge support assemblies includes:

an edge support frame attached to the rear surface of the flexible display panel, the edge support frame including a receiving groove;

a rigid bar positioned in the receiving groove of the edge support frame and fixed to the main body;

a ring member positioned in the receiving groove of the edge support frame and fitted around the rigid bar; and a cap member covering a top of the rigid bar.

10. The display apparatus of claim 9, wherein the ring member includes a through-hole having a length greater than a diameter of the rigid bar.

11. The display apparatus of claim 1, wherein each of the two edge support assemblies includes:

an edge support frame attached to the rear surface of the flexible display panel;

a rigid bar positioned in a receiving groove of the edge support frame and rotatably connected to the main body;

a ring assembly positioned in the receiving groove of the edge support frame and fitted around the rigid bar; and a cap member positioned in the receiving groove of the edge support frame, wherein the cap member covers a top of the rigid bar, and wherein rotation of the rigid bar causes the ring assembly to move vertically, such that a length of each of the two edge support assemblies is changed.

12. The display apparatus of claim 11, wherein the ring assembly includes:

an outer ring member having a first through-hole; and an inner ring member positioned in the first through-hole of the outer ring member, and wherein the inner ring member is movable within the first through-hole of the outer ring member.

13. The display apparatus of claim 12, wherein the inner ring member includes:

a nut; and a protrusion disposed on an outer circumferential surface of the nut, wherein the outer ring member further includes a second through-hole, and wherein the protrusion of the inner ring member is positioned in the second through-hole of the outer ring member.

14. The display apparatus of claim 11, wherein the main body further includes:

a gear box connected to the rigid bar; and a motor connected to the gear box, the motor being configured to rotate of the gear box to cause rotation of the rigid bar.

15. A display apparatus comprising:

a flexible display panel;

a central support assembly supporting a central portion of the flexible display panel and directly coupled to a rear surface of the flexible display panel; and a main body including:

a linear driver coupled to a lower portion of the central support assembly; and an opening defined in a central position of the main body, wherein the linear driver is configured to move the central support assembly and the central portion of the flexible display panel along the opening in a first direction of the main body to cause the flexible display panel to bend, wherein the central support assembly has a greater thickness at a first end contacting the main body than a second end located away from the main body, and wherein the central support assembly is configured to contact the flexible display panel at both the first end contacting the main body and the second end located away from the main body.

16. The display apparatus of claim 15, wherein the display apparatus further comprises two edge support assemblies respectively supporting opposing sides of the flexible display panel, the two edge support assemblies being coupled to the rear surface of the flexible display panel.

17. The display apparatus of claim 16, wherein the two edge support assemblies rotate in opposite directions to each other as the central support assembly moves in the first direction.

18. The display apparatus of claim 16, wherein the two edge support assemblies simultaneously rotate and move in a second direction intersecting with the first direction as the central support assembly moves in the first direction.

19. The display apparatus of claim 16, wherein a length of each of the central support assembly and the two edge support assemblies increases or decreases as the central support assembly moves in the first direction so as to change a height of the flexible display panel.

20. A display apparatus comprising:

a main body having a curved shape;

a display panel coupled to the main body and configured to move to alter its curvature; and a central support assembly including a central support bar directly coupled to a rear surface of the display panel and movable relative to remaining components of the central support assembly, wherein the display panel is movable in a first direction with respect to the main body by the central support bar, wherein the central support assembly has a greater thickness at a first end contacting the main body than a second end located away from the main body, and wherein the central support assembly is configured to contact the display panel at both the first end contacting the main body and the second end located away from the main body.

21. The display apparatus of claim 20, further comprising two edge support assemblies coupled to opposing sides of the rear surface of the display panel, wherein each of the two edge support assemblies includes a rigid bar coupling the display panel to the main body.

22. The display apparatus of claim 21, wherein the rigid bars remain fixed while the display panel moves with respect to the main body.

23. The display apparatus of claim 20, wherein the central support assembly includes a central support frame including a protrusion, wherein the protrusion of the central support frame includes a groove, and wherein the central support bar is slidably disposed within the groove of the protrusion of the central support frame.

* * * * *